(12) United States Patent
Jeon et al.

(10) Patent No.: US 12,300,676 B2
(45) Date of Patent: May 13, 2025

(54) FINGERPRINT RECOGNITION MODULE AND ELECTRONIC DEVICE COMPRISING SAME

(71) Applicant: LG INNOTEK CO., LTD., Seoul (KR)

(72) Inventors: Seung Ho Jeon, Seoul (KR); So Hee Choi, Seoul (KR); Jae Heung Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 403 days.

(21) Appl. No.: 17/781,161

(22) PCT Filed: Nov. 27, 2020

(86) PCT No.: PCT/KR2020/017085
§ 371 (c)(1),
(2) Date: May 31, 2022

(87) PCT Pub. No.: WO2021/112498
PCT Pub. Date: Jun. 10, 2021

(65) Prior Publication Data
US 2023/0005893 A1   Jan. 5, 2023

(30) Foreign Application Priority Data
Dec. 2, 2019 (KR) .......... 10-2019-0158076

(51) Int. Cl.
*H01L 25/16* (2023.01)
*G06V 40/13* (2022.01)
(Continued)

(52) U.S. Cl.
CPC .......... *H01L 25/16* (2013.01); *G06V 40/1306* (2022.01); *H01L 23/5386* (2013.01);
(Continued)

(58) Field of Classification Search
CPC . H01L 25/16; H01L 23/5386; H01L 23/5387; H01L 24/05; H01L 24/08;
(Continued)

(56) References Cited

U.S. PATENT DOCUMENTS

| 8,354,962 | B2 | 1/2013 | Aoki |
| 10,761,627 | B2 | 9/2020 | Kim et al. |

(Continued)

FOREIGN PATENT DOCUMENTS

| JP | 2001-177081 | 6/2001 |
| JP | 2011-142648 | 7/2011 |

(Continued)

OTHER PUBLICATIONS

International Search Report dated Mar. 22, 2021 issued in Application No. PCT/KR2020/017085.
(Continued)

*Primary Examiner* — Wassim Mahrouka
(74) *Attorney, Agent, or Firm* — KED & ASSOCIATES, LLP

(57) ABSTRACT

A fingerprint recognition module according to an embodiment includes a substrate; a conductive pattern portion disposed on the substrate; a protective layer partially disposed on the substrate and the conductive pattern portion; a first connection portion disposed on a conductive pattern portion exposed through a first open region of the protective layer; and a first chip disposed on the first connection portion; wherein the first connection portion includes an anisotropic conductive adhesive disposed on the conductive pattern portion exposed through the first open region and having a closed loop shape and including conductive particles.

20 Claims, 17 Drawing Sheets

(51) Int. Cl.
*H01L 23/00* (2006.01)
*H01L 23/538* (2006.01)

(52) U.S. Cl.
CPC .......... *H01L 23/5387* (2013.01); *H01L 24/05* (2013.01); *H01L 24/08* (2013.01); *H01L 24/16* (2013.01); *H01L 24/32* (2013.01); *H01L 24/73* (2013.01); *H01L 2224/05644* (2013.01); *H01L 2224/08225* (2013.01); *H01L 2224/16227* (2013.01); *H01L 2224/32227* (2013.01); *H01L 2224/32237* (2013.01); *H01L 2224/73204* (2013.01); *H01L 2924/1203* (2013.01); *H01L 2924/1433* (2013.01); *H01L 2924/19041* (2013.01)

(58) Field of Classification Search
CPC ......... H01L 24/16; H01L 24/32; H01L 24/73; H01L 2224/05644; H01L 2224/08225; H01L 2224/16227; H01L 2224/32227; H01L 2224/32237; H01L 2224/73204; H01L 2924/1203; H01L 2924/1433; H01L 2924/19041; H01L 23/00; H01L 23/482; H01L 23/528; H01L 25/167; H01L 23/4828; H01L 23/49816; H01L 24/06; H01L 25/0655; G06V 40/1306
See application file for complete search history.

(56) References Cited

U.S. PATENT DOCUMENTS

| | | |
|---|---|---|
| 11,100,351 B2 | 8/2021 | Im et al. |
| 2021/0209325 A1* | 7/2021 | Liu ........................ H05K 3/323 |

FOREIGN PATENT DOCUMENTS

| | | |
|---|---|---|
| KR | 10-2015-0025973 | 3/2015 |
| KR | 10-2016-0075464 | 6/2016 |
| KR | 10-2017-0084941 | 7/2017 |
| KR | 10-2019-0005354 | 1/2019 |
| KR | 10-2019-0076679 | 7/2019 |
| KR | 10-2019-0085619 | 7/2019 |

OTHER PUBLICATIONS

Korean Office Action dated Jan. 24, 2024 issued in Application No. 10-2019-0158076.

* cited by examiner

[FIG. 1A]
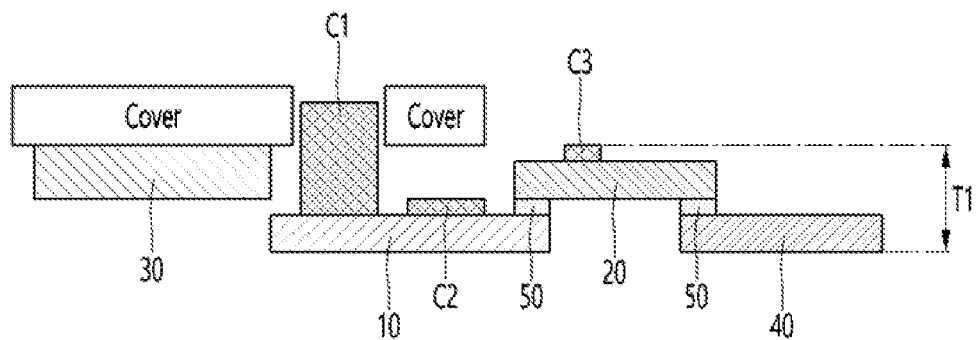
[FIG. 1B]
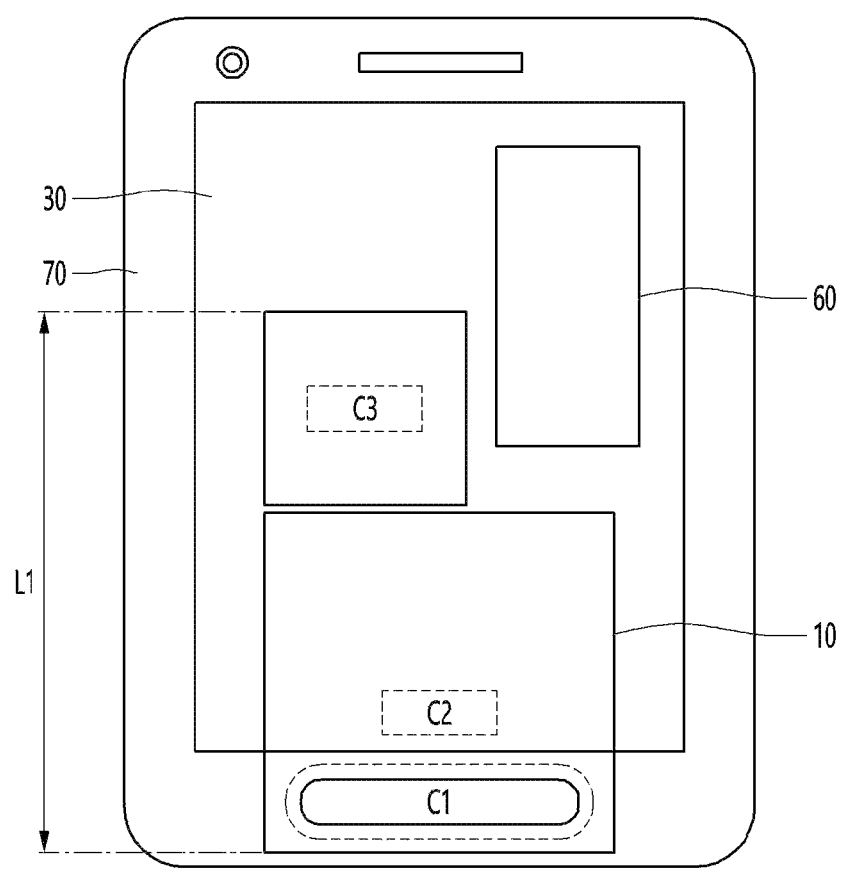

【FIG. 2A】
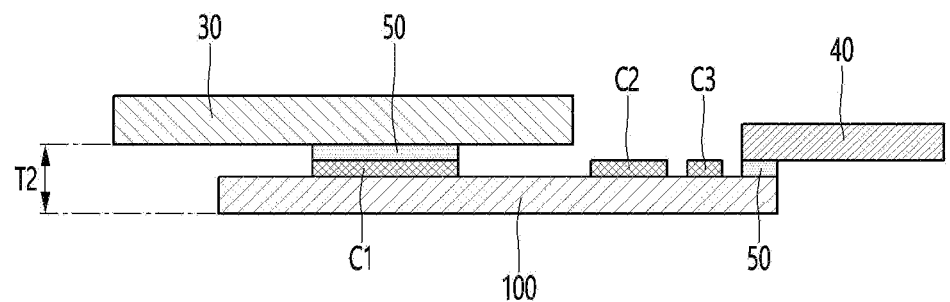
【FIG. 2B】
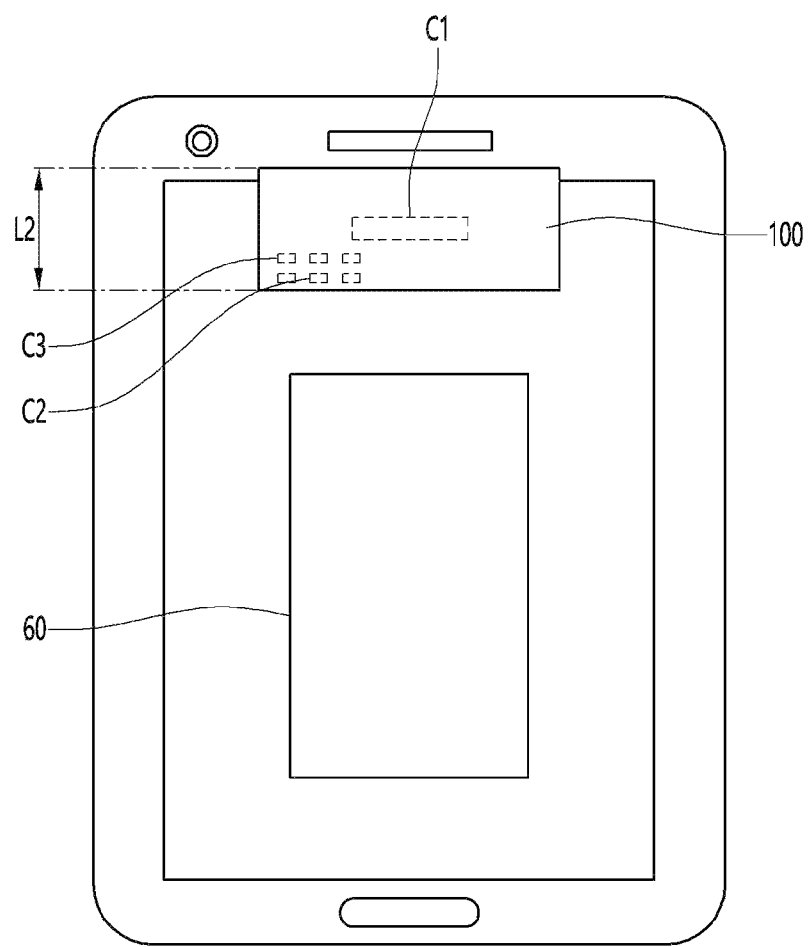

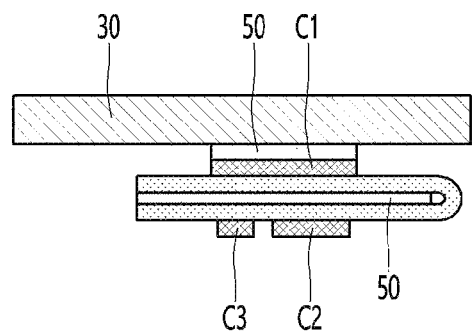
[FIG. 2C]

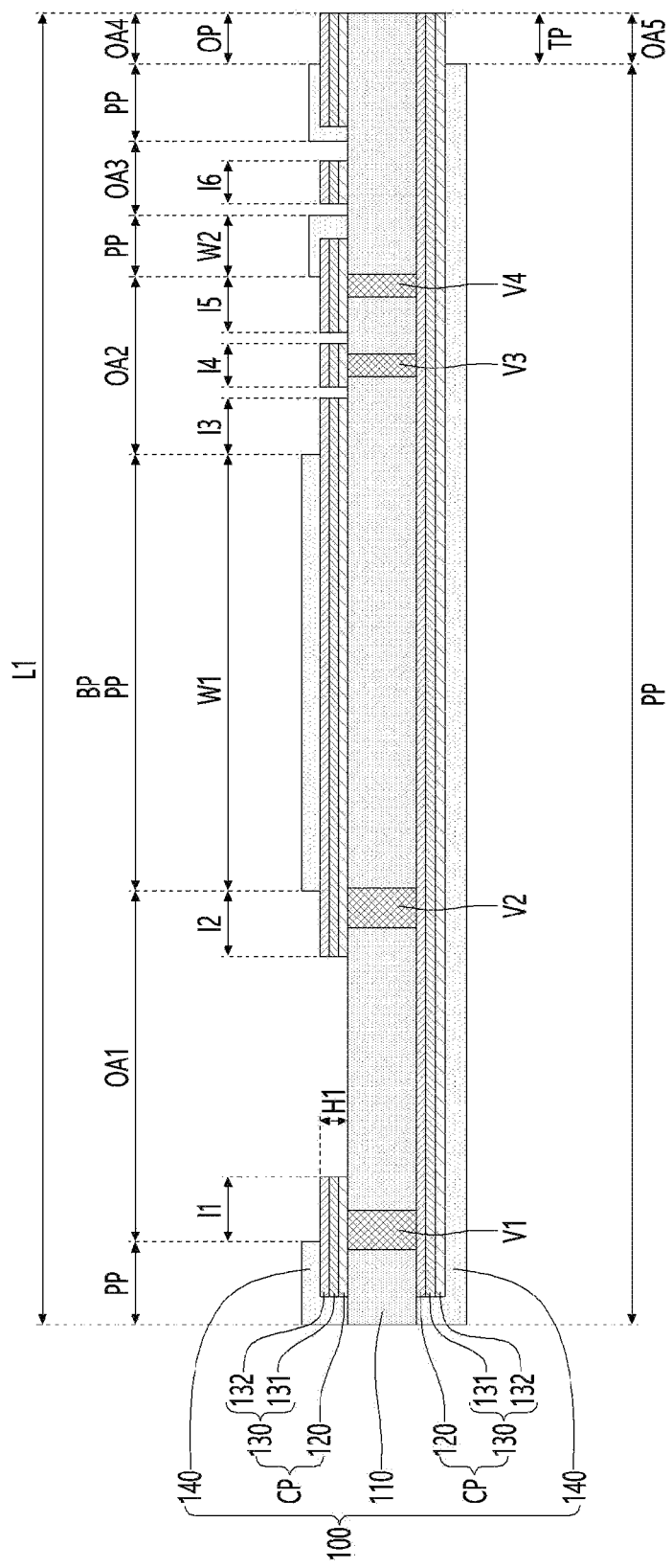
[FIG. 3A]

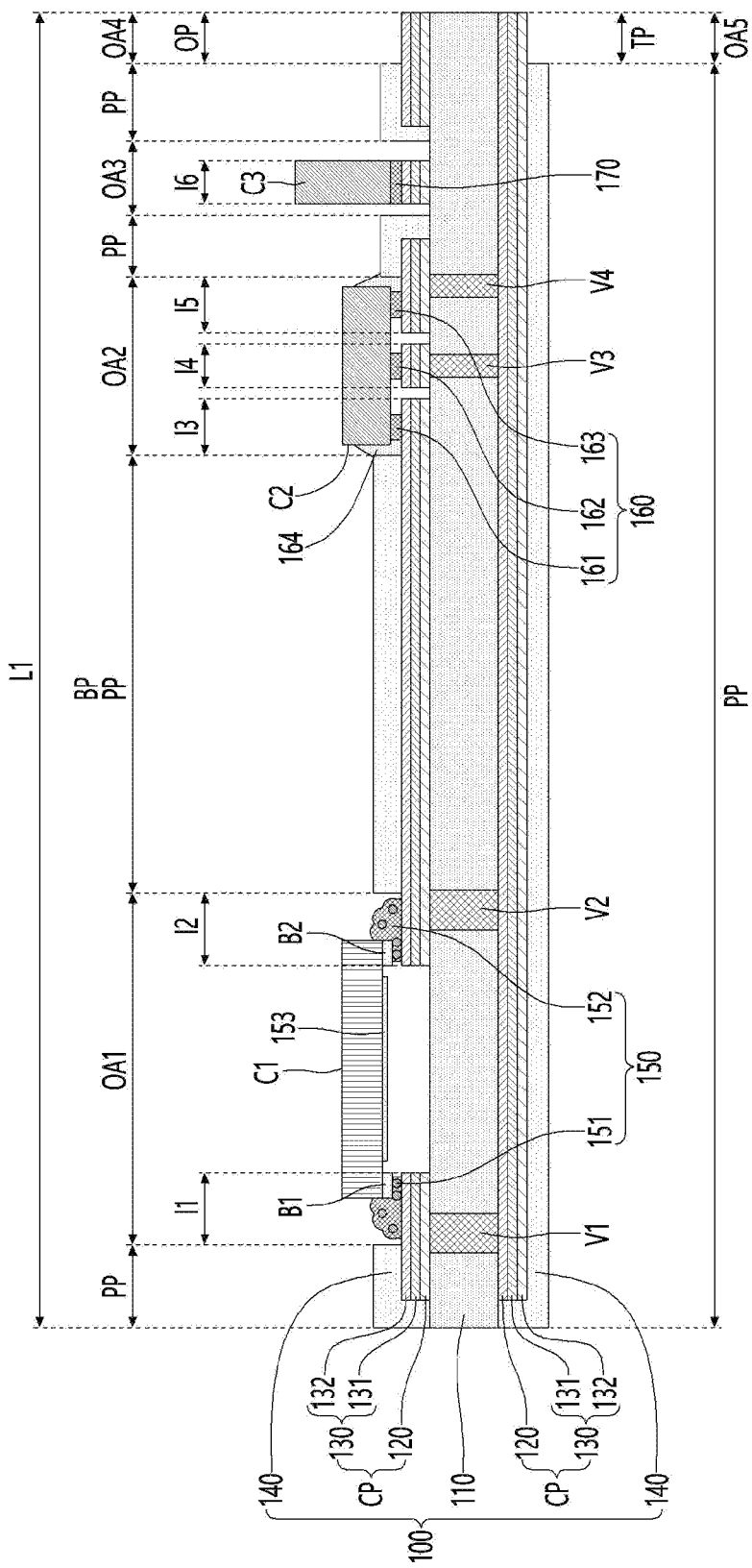
[FIG. 3B]

[FIG. 3C]
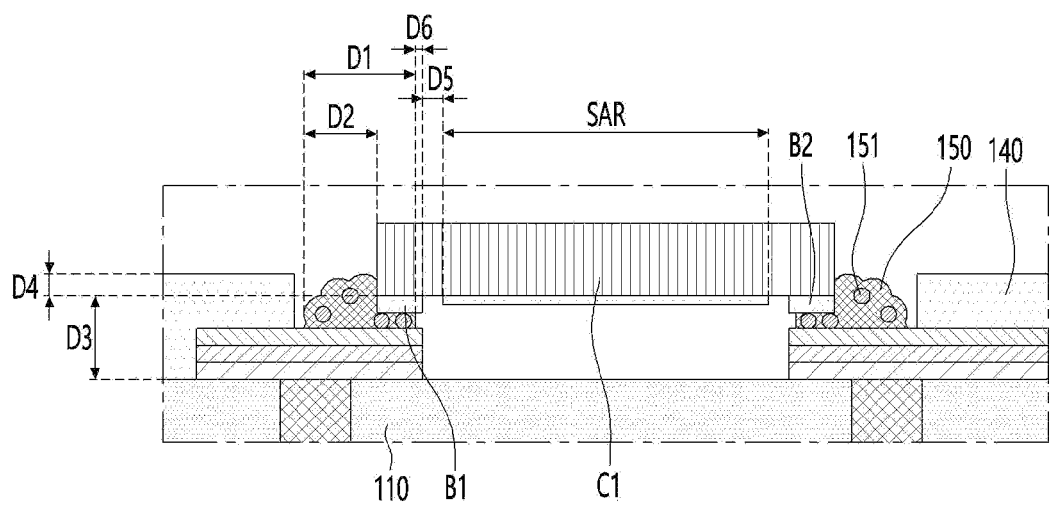

[FIG. 3D]
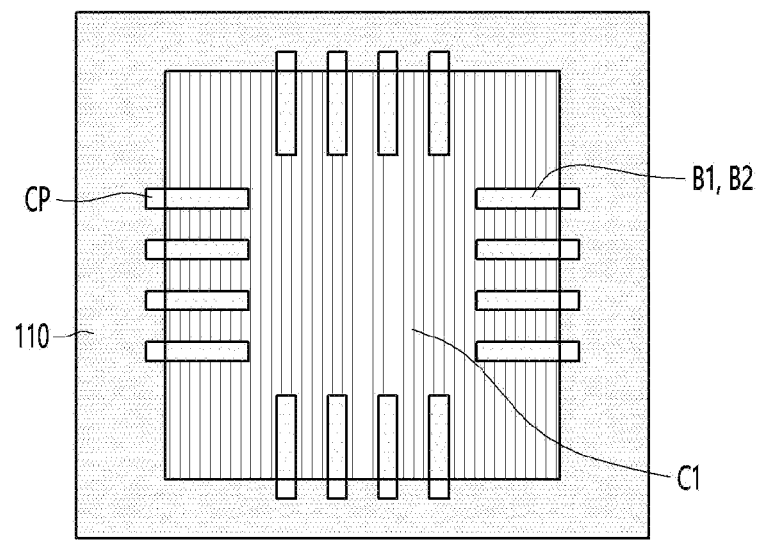
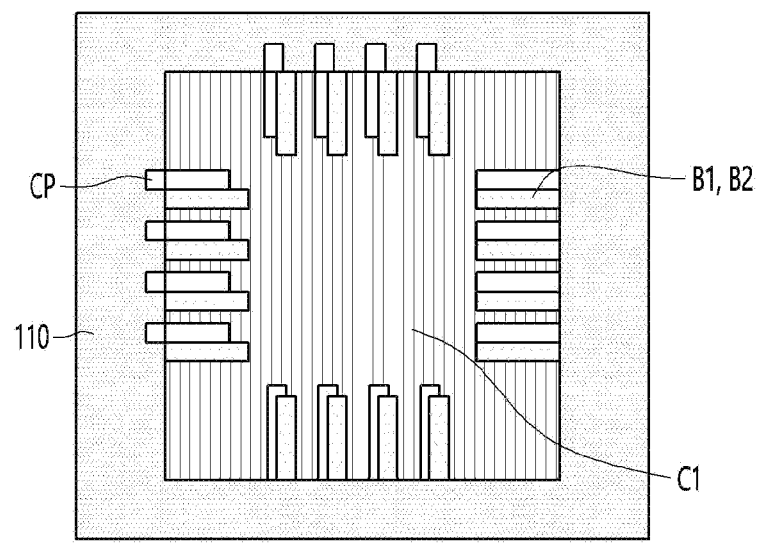

[FIG. 3E]
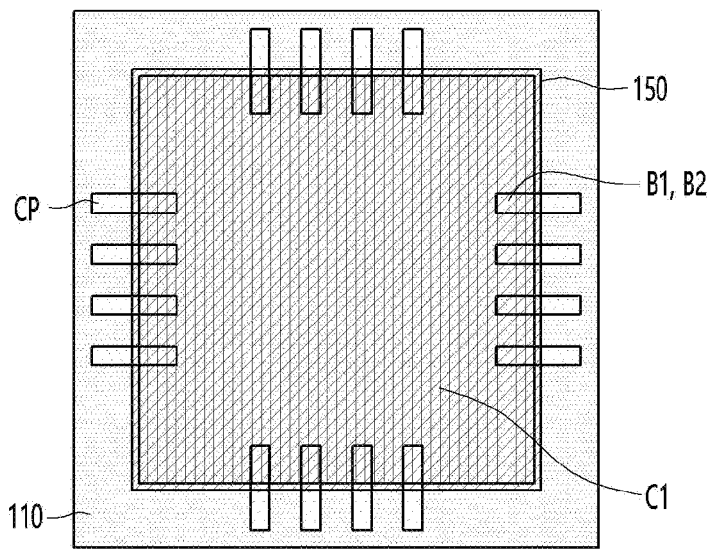
[FIG. 4]
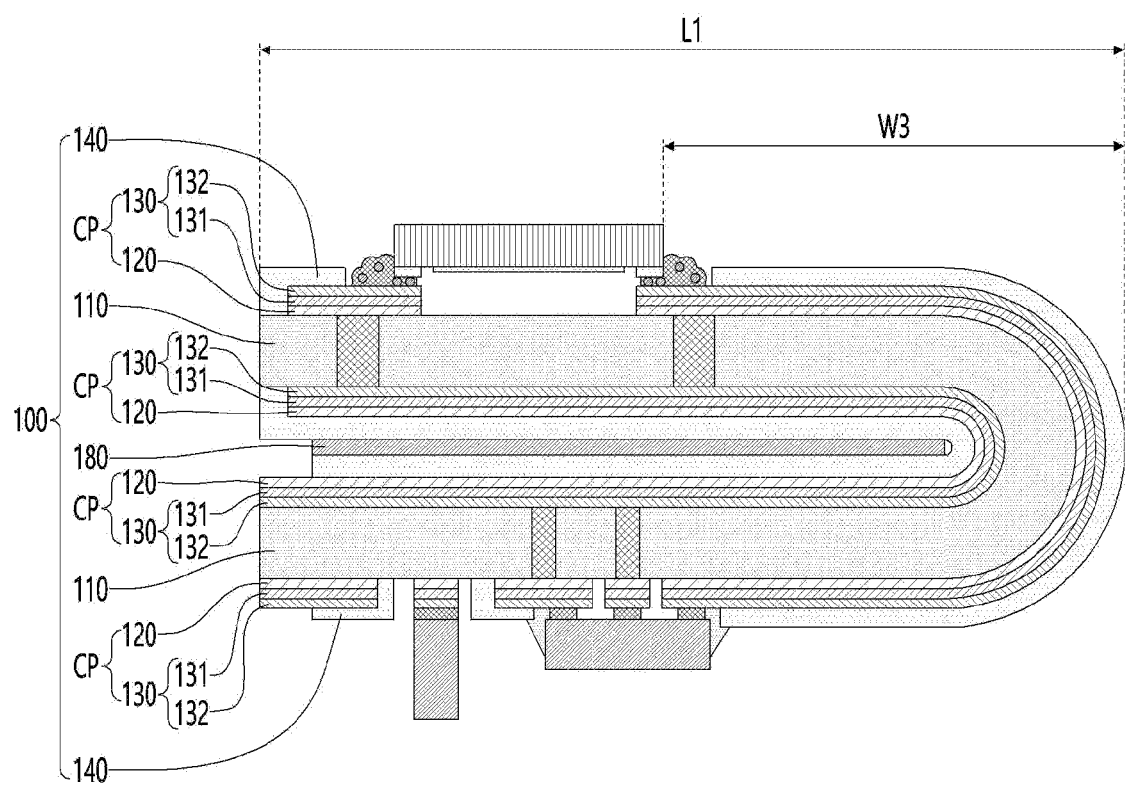

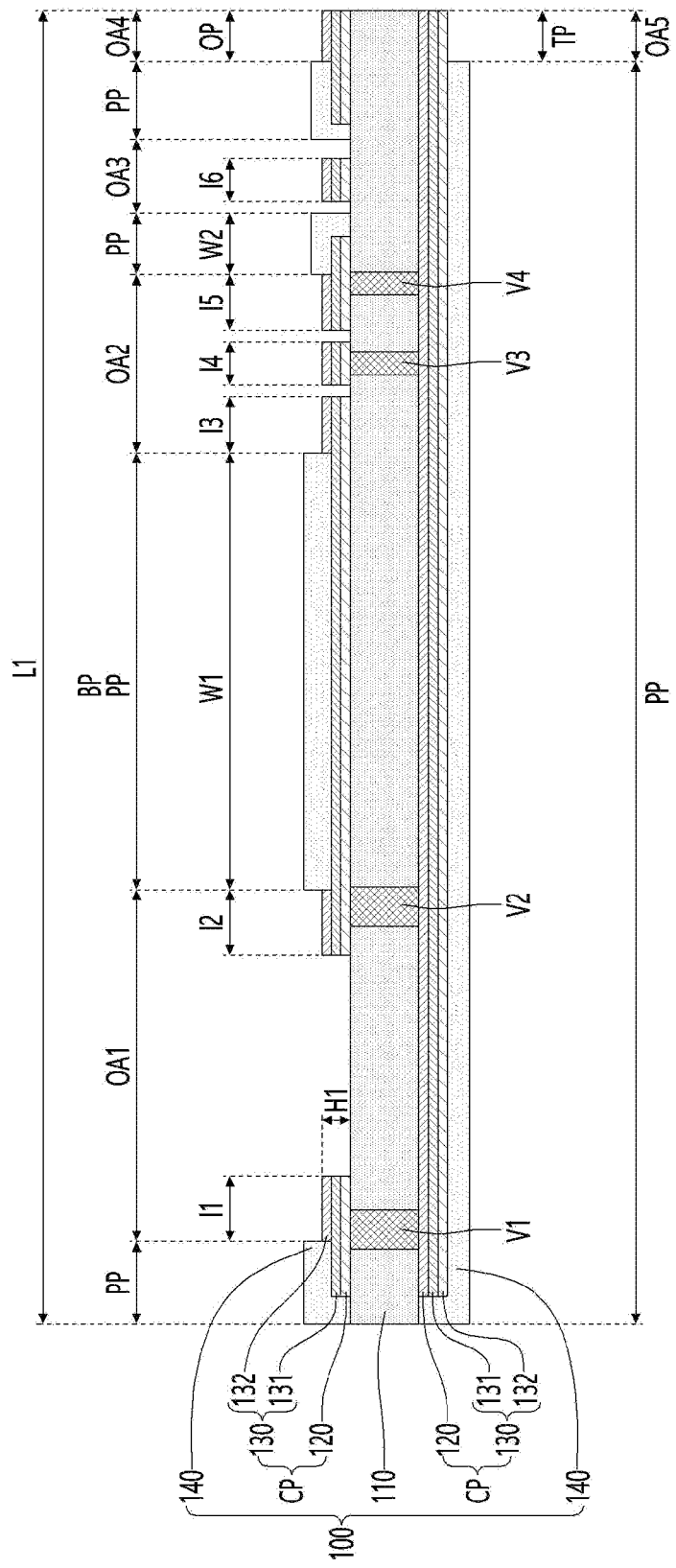
[FIG. 5]

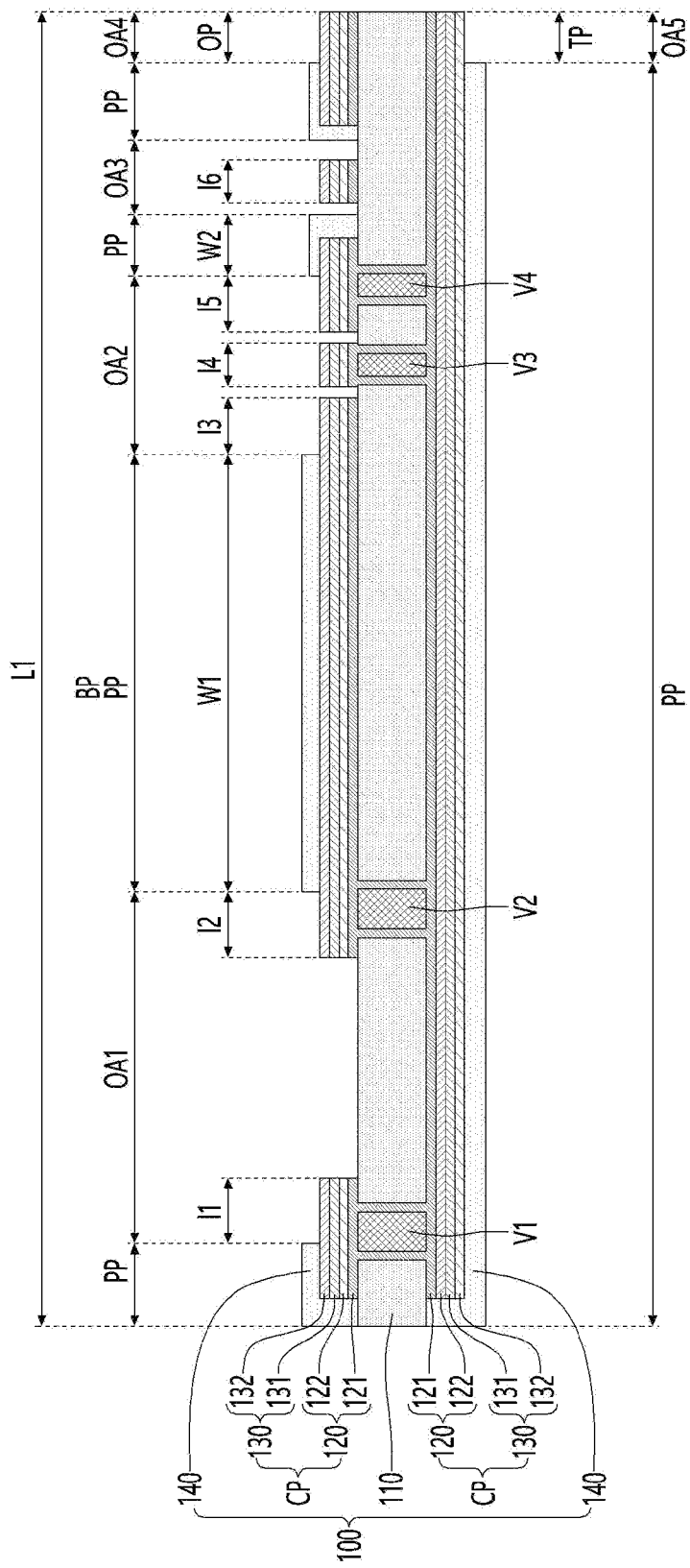
[FIG. 6]

【FIG. 7】
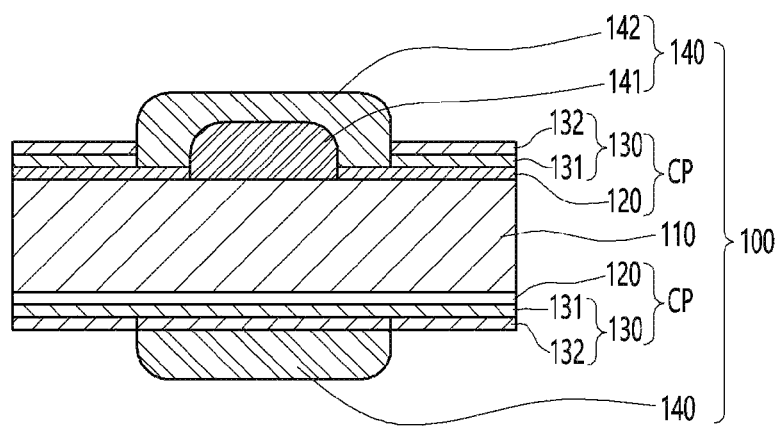
【FIG. 8A】
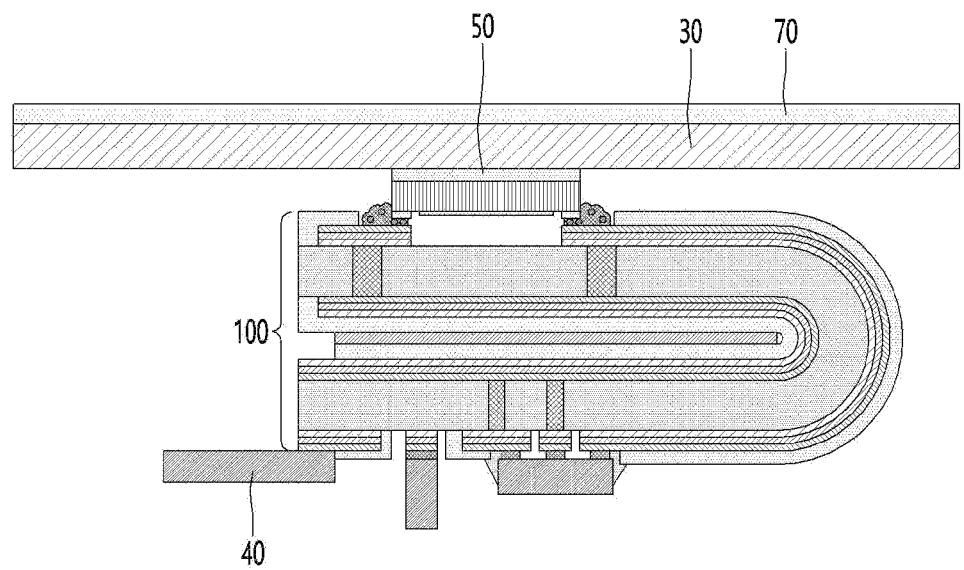

【FIG. 8B】
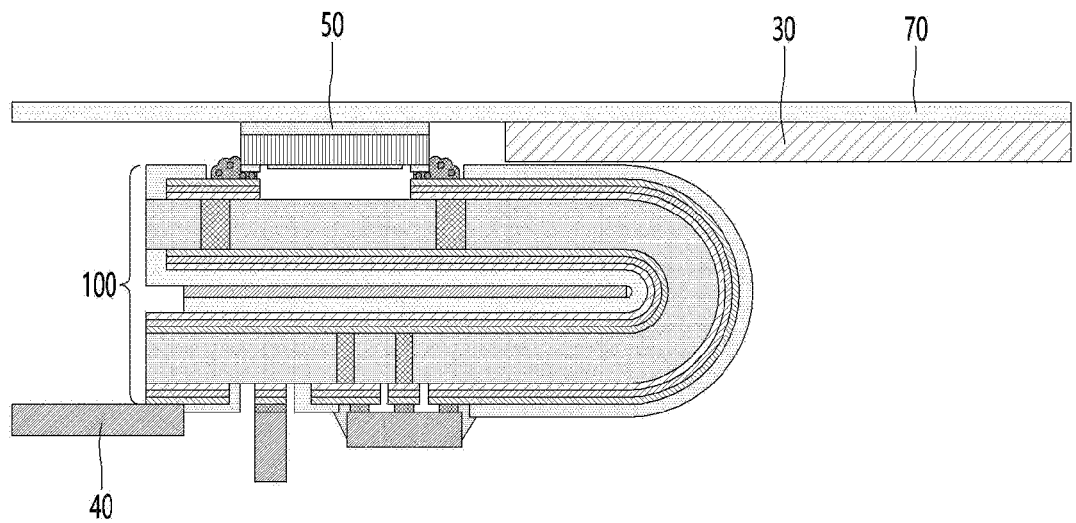
【FIG. 8C】
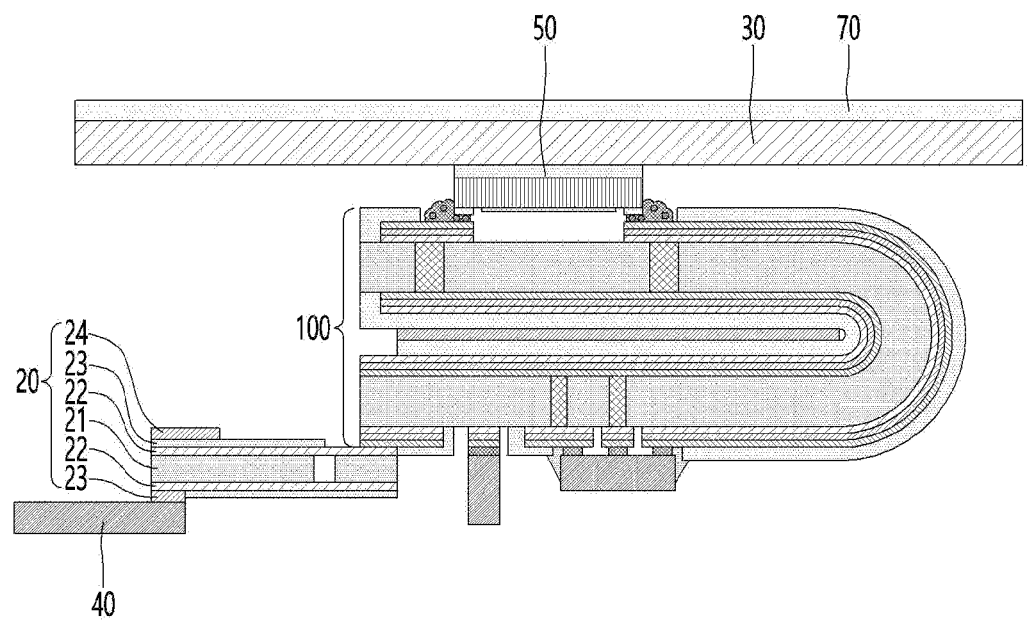

[FIG. 9]
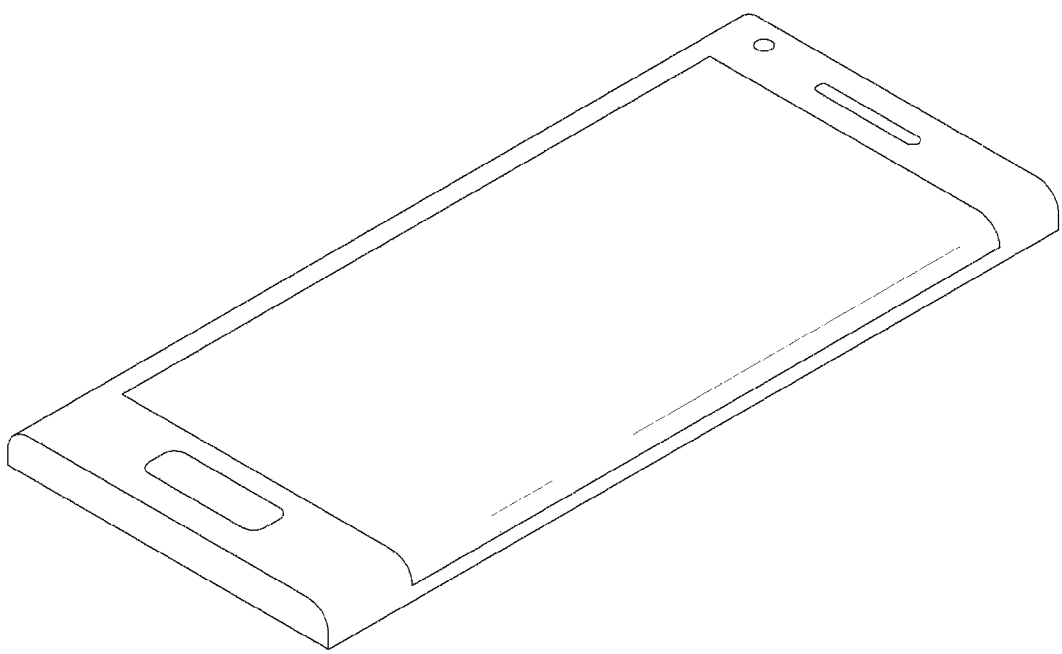

[FIG. 10]
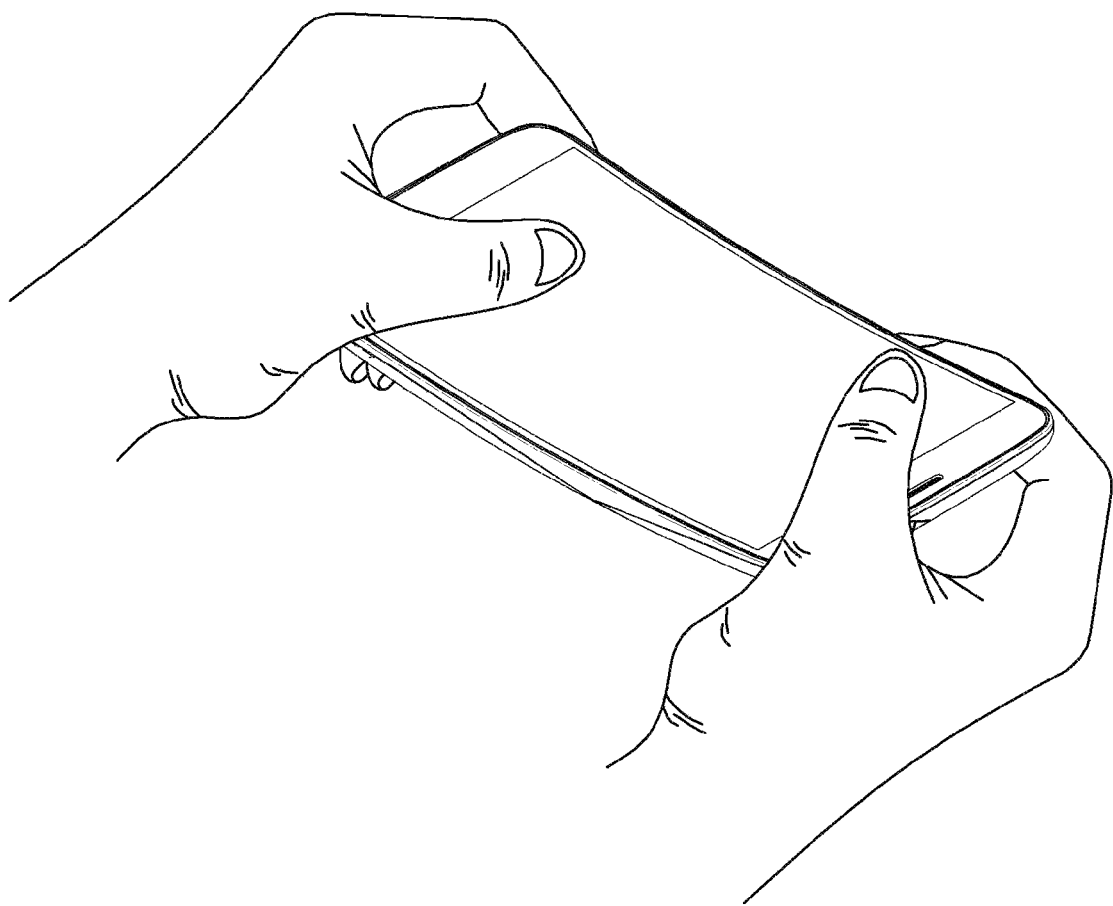

[FIG. 11A]
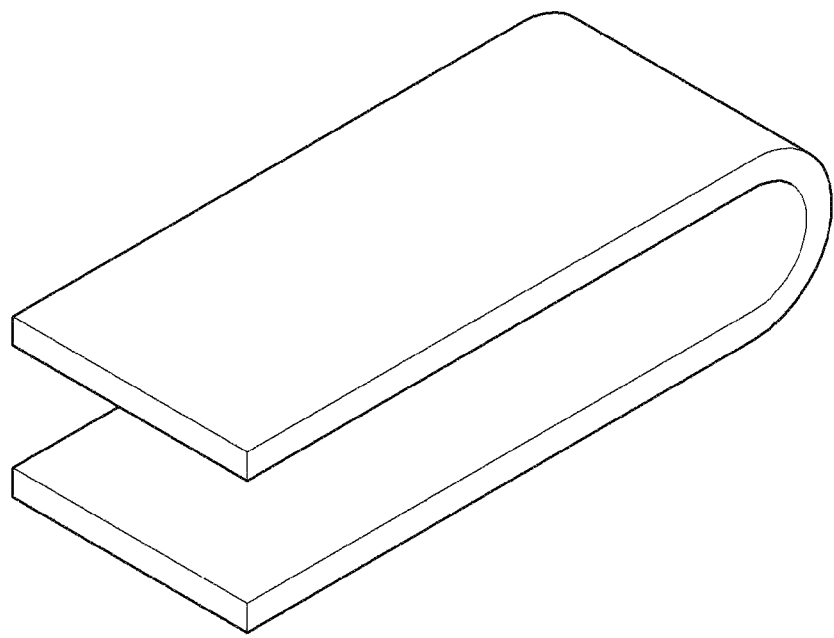
[FIG. 11B]
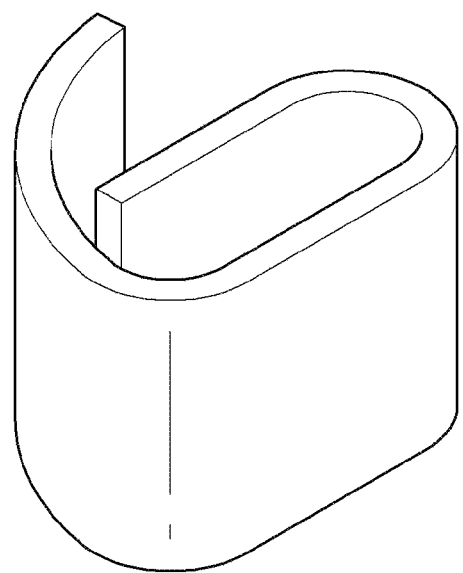

【FIG. 11C】
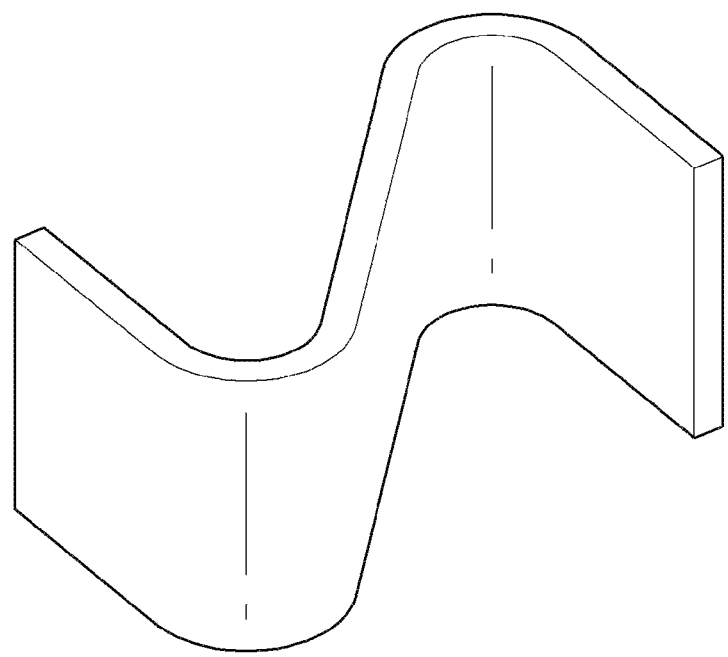
【FIG. 12】
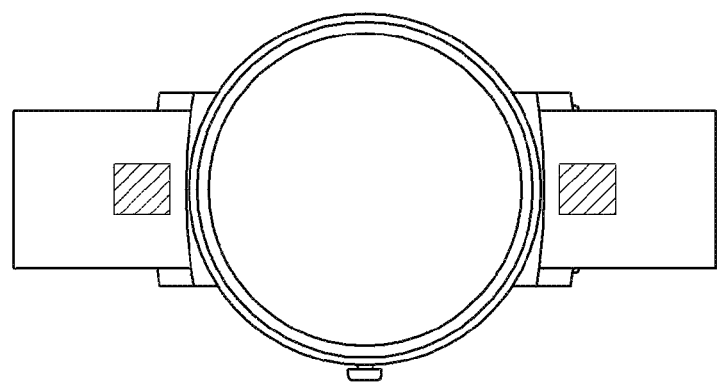

【FIG. 13】
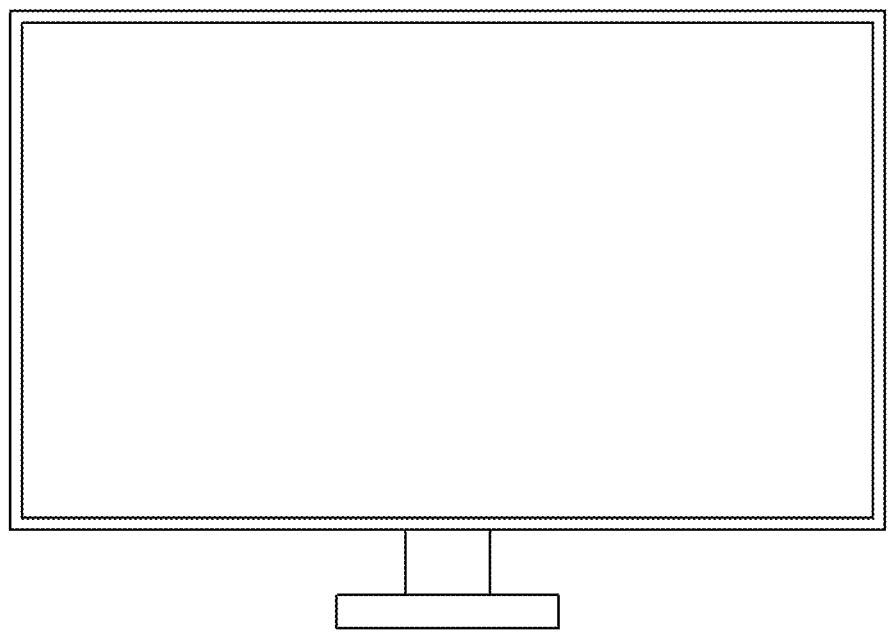

FINGERPRINT RECOGNITION MODULE AND ELECTRONIC DEVICE COMPRISING SAME

CROSS-REFERENCE TO RELATED PATENT APPLICATIONS

This application is a U.S. National Stage Application under 35 U.S.C. § 371 of PCT Application No. PCT/KR2020/017085, filed Nov. 27, 2020, which claims priority to Korean Patent Application No. 10-2019-0158076, filed Dec. 2, 2019, whose entire disclosures are hereby incorporated by reference.

TECHNICAL FIELD

The embodiment relates to a fingerprint recognition module and an electronic device including the fingerprint recognition module.

BACKGROUND ART

A fingerprint recognition sensor is a sensor for detecting fingerprints of a human finger, and is recently widely used as a means for enhancing security in portable electronic devices such as smartphones and tablet computers. That is, by performing a user registration or security authentication procedure through the fingerprint recognition sensor, the data stored in the portable electronic device may be protected and a security incident may be prevented in advance. In general, the smartphone has a home key at a bottom front. The home key realizes various functions of the smartphone in a one-touch manner, thereby improving convenience of use. Meanwhile, the tablet computer has a home key on the bottom front of a main body, similar to the smartphone described above. In this way, on the smartphones and tablet computers, the home key allows the portable device to perform a set operation. For example, when using a portable electronic device, pressing or touching the home key provides a convenient function such as returning to an initial screen.

Meanwhile, a fingerprint recognition module has a structure in which a fingerprint recognition sensor and an application specific integrated circuit (ASIC) are mounted on a substrate. However, such a fingerprint recognition module may not be directly connected to a main board. That is, a printed circuit board is required between the fingerprint recognition module and the main board.

An electronic device having a display unit requires a plurality of printed circuit boards, and thus there is a problem that a thickness is increased. In addition, sizes of the plurality of printed circuit boards may be a limitation on miniaturization of the electronic device. Further, poor bonding of the plurality of printed circuit boards may deteriorate reliability of the electronic device.

In addition, the fingerprint recognition module performs a high-temperature bonding process at 250° C. or higher for mounting the fingerprint recognition sensor on a substrate. However, the fingerprint recognition sensor as described above is a sensor containing a polymer compound, and thus has a characteristic vulnerable to high temperature. Accordingly, when bonding the fingerprint recognition sensor at a high temperature as described above, there is a problem in that the function of the sensor is lost due to thermal shock or parts change due to high temperature and misalignment of the bonding position occur.

Therefore, a fingerprint recognition module of a new structure that may solve such a problem is required.

DISCLOSURE

Technical Problem

An embodiment provides a fingerprint recognition module including a flexible circuit board for chip on film that may be directly connected to a main board of an electronic device while a fingerprint recognition sensor and an ASIC are mounted on a single substrate, and an electronic device including the fingerprint recognition module.

In addition, the embodiment provides a fingerprint recognition module in which a low-temperature curing type anisotropic conductive adhesive is used to mount the fingerprint recognition sensor on a substrate, and thus the anisotropic conductive adhesive has a structure surrounding a side surface of the fingerprint recognition sensor, and an electronic device including the fingerprint recognition module.

It is to be understood that the technical objectives to be achieved by the embodiments are not limited to the technical matters mentioned above and that other technical subjects not mentioned are apparent to those skilled in the art to which the embodiments proposed from the following description belong.

Technical Solution

A fingerprint recognition module according to an embodiment includes a substrate; a conductive pattern portion disposed on the substrate; a protective layer partially disposed on the substrate and the conductive pattern portion; a first connection portion disposed on a conductive pattern portion exposed through a first open region of the protective layer; and a first chip disposed on the first connection portion; wherein the first connection portion includes an anisotropic conductive adhesive disposed on the conductive pattern portion exposed through the first open region and having a closed loop shape and including conductive particles.

In addition, the first connection portion extends upwardly in a region between the conductive pattern portion and the first chip and surrounds a side surface of the first chip.

In addition, a width in a vertical direction of the first connection portion disposed on the side surface of the first chip has a range of 20% to 90% of a thickness of the first chip.

In addition, the first connection portion includes a first portion disposed on the conductive pattern portion exposed through the first open region; and a second portion connected to the first portion and disposed on the substrate between the exposed conductive pattern portion.

In addition, conductive particles disposed in the first portion electrically connect a bump disposed on a lower surface of the first chip and the exposed conductive pattern portion, and wherein conductive particles disposed in the second portion are separated from the conductive particles disposed in the first portion.

In addition, a width in a horizontal direction of the first connection portion has a range between 0.05 mm and 5 mm.

In addition, a lower surface of the bump of the first chip includes: a first lower surface in contact with the first connection portion; and a second lower surface that is not in contact with the first connection portion; wherein the second lower surface is adjacent to a sensing available region under the first chip.

In addition, the anisotropic conductive adhesive is an anisotropic conductive adhesive film or anisotropic conductive adhesive paste that is cured within a range between 80° C. and 150° C.

In addition, the first chip includes a fingerprint recognition sensor including a polymer compound.

In addition, the fingerprint recognition module further includes a second connection portion disposed on a conductive pattern portion exposed through a second open region of the protective layer; and a second chip disposed on the second connection portion; wherein the second connection portion includes a different material than the first connection portion, and the second chip includes an application specific integrated circuit.

In addition, the second connection portion includes a solder bump.

In addition, the fingerprint recognition module further includes a side molding portion disposed on the second connection portion and disposed to surround a periphery of the second chip.

Meanwhile, an electronic device according to an embodiment includes a fingerprint recognition module including a substrate; a conductive pattern portion disposed on the substrate; a protective layer partially disposed on the substrate and the conductive pattern portion; a first connection portion disposed on a conductive pattern portion exposed through a first open region of the protective layer; a first chip disposed on the first connection portion; a second connection portion disposed on a conductive pattern portion exposed through a second open region of the protective layer; a second chip disposed on the second connection portion; wherein the first connection portion includes an anisotropic conductive adhesive disposed on the conductive pattern portion exposed through the first open region and having a closed loop shape and including conductive particles, wherein the second connection portion includes a solder bump, wherein the first chip includes a fingerprint recognition sensor, and the substrate includes a first non-bending region positioned at one end, a second non-bending region positioned at the other end opposite to the one end, and a bending region positioned between the first and second non-bending regions, and wherein the first open region is positioned on the first non-bending region, and the second open region is positioned on the second non-bending region; a display unit attached on the first chip; and a main board connected to the conductive pattern portion disposed on the second non-bending region of the fingerprint recognition module.

In addition, the display unit includes a display panel; and a cover window positioned on the display panel, wherein the first chip is attached to a lower surface of the display panel or a lower surface of the cover window.

Advantageous Effects

According to this embodiment, a fingerprint recognition sensor is mounted on a substrate using an anisotropic conductive adhesive of a low temperature curing type. According to this, it is possible to bond the sensor containing the polymer compound to the COF, and accordingly, it is possible to solve the problem of sensor loss due to sensor position deformation and thermal shock due to the high-temperature process of a conventional method.

In addition, according to this embodiment, when mounting the fingerprint recognition sensor on the anisotropic conductive adhesive, the anisotropic conductive adhesive is arranged to surround the side surface of the fingerprint recognition sensor. According to this, since the anisotropic conductive adhesive is disposed around the periphery of the fingerprint recognition sensor, a side-fill process that is additionally performed for the purpose of protecting the sensor can be eliminated.

In addition, according to this embodiment, it is possible to form an additional space between the substrate and the fingerprint recognition sensor due to the height of the conductive particles in the anisotropic conductive adhesive, thereby improving the characteristics of the fingerprint recognition sensor requiring oscillation, and accordingly, operation reliability can be improved.

In addition, according to the embodiment, a flexible circuit board for chip on film having a two-layer structure is applied to a substrate of a fingerprint recognition module, and accordingly, a substrate area may be drastically reduced in response to a fine pitch. Moreover, the fine pitch may be implemented (Line/Space=10 μm or less/15 μm or less) by using a polyimide substrate, thereby reducing a size of the fingerprint recognition module.

In addition, according to the embodiment, different types of first chip, second chip, and third chip may be mounted on one substrate, thereby providing a fingerprint recognition module with improved reliability.

In addition, according to the embodiment, a vibration space for a fingerprint sensor may be secured by forming an inner lead pattern portion on which the fingerprint sensor is mounted to have a height of 7 μm or more, and accordingly, the operational reliability of the fingerprint sensor may be improved.

In addition, according to the embodiment, a fingerprint recognition module and a main board may be directly connected. Accordingly, a size and thickness of a flexible circuit board for transmitting a signal sensed by the fingerprint recognition module to the main board may be reduced. Moreover, it is possible to reduce a signal distance in which a signal formed by a fingerprint recognition chip is transmitted to the main board, thereby performing quickly fingerprint recognition.

Accordingly, a flexible circuit board for chip on film according to the embodiment, a chip package including the same, and an electronic device including the same may increase spaces of other components and/or a battery space.

In addition, since connection of a plurality of printed circuit boards is not required, convenience of a process and reliability of electrical connection may be improved.

Accordingly, the fingerprint recognition module according to the embodiment and the electronic device including the same may be suitable for an electronic device having a high-resolution display unit.

In addition, according to the embodiment of the present invention, it is possible to protect a first chip and a second chip from invasion or impact by adding a side molding portion to a periphery of the first chip and the second chip, and accordingly, the operational reliability may be improved.

In addition, according to the embodiment of the present invention, each distance from the first chip and the second chip is set to be at least 1.6 mm around a bending line. Therefore, when bending the fingerprint recognition module, it is possible to prevent a bonding portion from cracking due to a bending external force.

Further, according to the embodiment of the present invention, a distance between the second chip and a third chip is set to be at least 1.0 mm or more while being as close as possible. Therefore, it is possible to minimize signal loss that occurs as the distance between the second chip and the third chip increases. In addition, it is possible to prevent a displacement phenomenon of the third chip that occurs as the distance between the second chip and the third chip becomes closer than 1.0 mm.

In addition, according to the embodiment of the present invention, a flexible circuit board constituting a fingerprint recognition module has a bending structure. Accordingly, the entire length of the fingerprint recognition module may be reduced.

DESCRIPTION OF DRAWINGS

FIG. 1A is a cross-sectional view of an electronic device including a display unit including a conventional substrate.

FIG. 1B is a plan view of a printed circuit board according to FIG. 1A.

FIG. 2A is a cross-sectional view of an electronic device including a display unit including a fingerprint recognition module according to an embodiment.

FIG. 2B is a cross-sectional view of a form in which a flexible circuit board for chip on film of the fingerprint recognition module according to FIG. 2A is bent.

FIG. 2C is a plan view of a form in which a flexible circuit board for chip on film of the fingerprint recognition module according to FIG. 2A is bent.

FIG. 3A is a cross-sectional view showing a flexible circuit board of a fingerprint recognition module according to an embodiment of the present invention.

FIG. 3B is a cross-sectional view showing a fingerprint recognition module including the flexible circuit board of FIG. 3A.

FIG. 3C is an enlarged view of a partial region of FIG. 3B.

FIG. 3D is a view for explaining a misalignment problem according to a comparative example.

FIG. 3E is a plan view of an arrangement structure of a fingerprint recognition sensor according to an embodiment.

FIG. 4 is a view showing a bent shape of the fingerprint recognition module of FIG. 3B.

FIG. 5 is another cross-sectional view of a flexible circuit board for chip on film according to an embodiment.

FIG. 6 is still another cross-sectional view of a fingerprint recognition module including a flexible circuit board for chip on film according to an embodiment.

FIG. 7 is an enlarged cross-sectional view of one region of a flexible circuit board for chip on film according to an embodiment.

FIG. 8A is a cross-sectional view of an electronic device including a fingerprint recognition module according to an embodiment.

FIG. 8B is another cross-sectional view of an electronic device including a fingerprint recognition module according to an embodiment.

FIG. 8C is still another cross-sectional view of an electronic device including a fingerprint recognition module according to an embodiment.

FIGS. 9 to 13 are views of various electronic devices including a fingerprint recognition module.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The singular expression includes the plural expression unless the context clearly dictates otherwise.

It will be further understood that the terms "includes," or "have," when used herein, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described in detail with reference to the accompanying drawings.

A printed circuit board according to Comparative Example will be described with reference to FIGS. 1A to 1B.

An electronic device having a display unit requires at least two substrates in addition to a main board 40 in order to implement a fingerprint recognition function.

There may be at least two substrates included in the electronic device including the display unit according to Comparative Example.

The electronic device including the display unit according to Comparative Example may include a first substrate 10 and a second substrate 20.

The first substrate 10 was made of a flexible printed circuit board (FPCB) or a silicon wafer.

The second substrate 20 was made of the flexible printed circuit board (FPCB).

In the electronic device including the display unit according to Comparative Example, the first and second substrates are required between the display panel and the main board, and thus an overall thickness of the electronic device may be increased. Specifically, the electronic device including the display unit according to Comparative Example requires the first and second substrates stacked vertically, and thus the overall thickness of the electronic device may be increased.

The first substrate 10 and the second substrate 20 may be formed by different processes. For example, the first substrate 10 is manufactured by a general stacking process. The second substrate 20 may be manufactured by using a sheet method.

Since the first and second substrates according to Comparative Example are formed in different processes, process efficiency may be decreased.

In addition, since a chip package including the substrate according to Comparative Example has difficulty in a process of disposing different types of chips on one substrate, separate first and second substrates are required.

Further, the chip package including the substrate according to Comparative Example has a problem that it is difficult to connect different types of chips on one substrate.

In order to recognize and process or transmit a fingerprint from an object approaching an upper portion of a display panel 30, the first substrate 10 is connected to the second substrate 20, and the second substrate 20 is connected to a main board 40.

In the electronic device including the display unit according to Comparative Example, a separate adhesive layer 50 may be respectively required between a cover window 70 and the first substrate 10, the first substrate 10 and the second substrate 20, and the second substrate 20 and the main board 40. That is, in the electronic device including the display unit according to Comparative Example, a plurality of adhesive layers are required, and thus there is a problem that reliability of the electronic device may be lowered due to poor connection of the adhesive layer. In addition, the adhesive layer disposed between the first printed circuit board 10 and the second printed circuit board 20 connected vertically may increase the thickness of the electronic device.

Referring to FIG. 1B, since Comparative Example requires a plurality of substrates, a length L1 in one direction is a sum of lengths of the first substrate 10 and the second substrate 20, respectively. Normally, the length L1 is about 300 mm. In the electronic device according to Comparative Example, as a plurality of substrates are required, a space for mounting other components or a space for disposing a battery 60 may be reduced. In addition, since a fingerprint recognition component is mounted outside the display unit, there is a problem that a size of the entire device should be increased.

Recently, a component having various functions have been added to an electronic device such as a smartphone in order to enhance user convenience and security. For example, electronic devices such as smartphones and smart watches are equipped with a plurality of camera modules (dual camera module, dual camera module), and a component having various functions such as iris recognition and virtual reality (VR) is added. Accordingly, it is important to secure a space for mounting the added component.

In addition, various electronic devices such as wearable devices are required to increase a battery space in order to improve user convenience.

Therefore, a plurality of substrates used in conventional electronic devices are replaced with a single substrate, and thus importance of securing a space for mounting a new component or securing a space for increasing a battery size is emerged.

In the electronic device according to Comparative Example, different types of first chip, second chip, and third chip may be disposed on the first substrate 10 and second substrate 30, respectively. Accordingly, there was a problem that a thickness of the adhesive layer 50 between the first substrate 10 and the second substrate 30 and a thickness of the second substrate 30 increase a thickness of the electronic device.

In addition, there was a problem that a battery space corresponding to a size of the second substrate 30 or a space for mounting other components is reduced.

Further, there was a problem that poor bonding between the first and second substrates deteriorates reliability of the electronic device.

In addition, the electronic device according to the comparative example uses eutectic bonding of alloying a Sn plating layer when a first chip including a polymer compound such as a fingerprint recognition sensor is mounted on the first substrate 10. The eutectic bonding refers to a process of forming an alloy layer, which is usually carried out at a high temperature of 250° C. or higher. However, unlike a silicon-based chip having stable characteristics even at high temperatures, the eutectic bonding method of 250° C. or higher cannot be used in order to bond a sensor containing an unstable polymer compound at a high temperature. This is because sensors containing polymer compounds have thermal deformation or functional problems at high temperatures. Accordingly, when a chip such as a sensor including a polymer compound is mounted on a substrate by the eutectic bonding method, there is a problem in that a misalignment occurs between a lead pattern on the substrate and the bump of the chip.

In order to solve such problems, embodiments may provide a fingerprint recognition module including a flexible circuit board for chip on film of a new structure that may mount a plurality of chips on one substrate, and an electronic device including the same.

The same drawing numerals in the embodiments and Comparative Examples indicate the same components, and redundant description with Comparative Examples described above is omitted.

An electronic device mounted with a fingerprint recognition module including a flexible circuit board for chip on film according to an embodiment will be described with reference to FIGS. 2A to 2C.

The electronic device according to the embodiment may use one printed circuit board in order to transmit a fingerprint recognition signal obtained from an object approaching one side of a display panel to a main board.

The printed circuit board included in the electronic device including a display unit according to the embodiment may be one flexible printed circuit board. Accordingly, a fingerprint recognition module 100 including the flexible circuit board for chip on film according to the embodiment may be bent between the display unit and the main board facing each other to connect the display unit and the main board.

Specifically, the fingerprint recognition module 100 including the flexible circuit board for chip on film according to the embodiment may be one substrate for disposing a plurality of different types of chips.

The fingerprint recognition module 100 including the flexible circuit board for chip on film according to the embodiment may be a substrate for disposing different types of a first chip C1, a second chip C2, and a third chip C3.

A thickness t2 of the flexible circuit board for chip on film of the fingerprint recognition module 100 according to the embodiment may be 20 μm to 100 μm before bending. For example, the thickness t2 before bending the flexible circuit board for chip on film according to the embodiment may be 30 μm to 80 μm. For example, the thickness t2 of before bending the flexible circuit board for chip on film according to the embodiment may be 70 μm to 75 μm.

The thickness t2 before bending the flexible circuit board for chip on film of the fingerprint recognition module 100 according to the embodiment may have a thickness of ⅕ to ½ level of a total thickness t1 of the plurality of substrates according to Comparative Example. That is, the thickness t2 before bending the flexible circuit board for chip on film according to the embodiment may have a thickness of 20% to 50% level of the thickness t1 of the plurality of substrates according to Comparative Example. For example, the thickness t2 before bending the flexible circuit board for chip on film according to the embodiment may have a thickness of 25% to 40% level of the thickness t1 of the plurality of substrates according to Comparative Example. For example, the thickness t2 before bending the flexible circuit board for chip on film according to the embodiment may have a thickness of 25% to 35% level of the thickness t1 of the plurality of substrates according to Comparative Example.

Since the electronic device including the display unit according to the embodiment requires only one flexible circuit board for chip on film between the display panel and the main board, the overall thickness of the electronic device may be reduced.

In addition, the embodiment may omit an adhesive layer 50 between a first substrate and a second substrate included in Comparative Example, and thus the overall thickness of a chip package including the flexible circuit board for chip on film and the electronic device including same may be reduced.

Further, since the embodiment may omit the adhesive layer 50 between the first substrate and the second substrate, a problem due to the adhesion failure may be solved, thereby improving reliability of the electronic device.

Furthermore, since a bonding process of a plurality of substrates may be omitted, process efficiency may be increased and a process cost may be reduced.

Furthermore, management of the substrate in a separate process is replaced by management in one process, thereby improving the process efficiency and the product yield.

The flexible circuit board for chip on film of the fingerprint recognition module 100 according to the embodiment may include a bending region and a non-bending region. The fingerprint recognition module 100 including the flexible circuit board for chip on film according to the embodiment includes the bending region, and thus the fingerprint recognition module 100 including the flexible circuit board for chip on film may be disposed between the display panel 30 and the main board 40 that are disposed to face each other.

The non-bending region of the fingerprint recognition module 100 including the flexible circuit board for chip on film according to the embodiment may be disposed to face the display panel 30. The first chip C1 may be disposed on the non-bending region of the fingerprint recognition module 100 including the flexible circuit board for chip on film according to the embodiment. Accordingly, the fingerprint recognition module 100 including the flexible circuit board for chip on film according to the embodiment may stably mount the first chip C1. In addition, the second chip C2 and the third chip C3 may be disposed on the non-bending region of the fingerprint recognition module 100 including the flexible circuit board for chip on film according to the embodiment. Accordingly, the fingerprint recognition module 100 including the flexible circuit board for chip on film according to the embodiment may stably mount the second chip C2 and the third chip C3.

FIG. 2C is a plan view of a lower surface in FIG. 2B.

Referring to FIG. 2C, since an embodiment requires one substrate, a length L2 in one direction may be a length of one substrate. The length L2 in one direction of a fingerprint recognition module 100 including a flexible circuit board for chip on film according to the embodiment may be a length of the fingerprint recognition module 100 including the flexible circuit board for chip on film according to the embodiment. As an example, the length L2 in one direction of the fingerprint recognition module 100 including the flexible circuit board for chip on film according to the embodiment may be 10 mm to 50 mm. For example, the length L2 in one direction of the fingerprint recognition module 100 including the flexible circuit board for chip on film according to the embodiment may be 10 mm to 30 mm. For example, the length L2 in one direction of the fingerprint recognition module 100 including the flexible circuit board for chip on film according to the embodiment may be 15 mm to 25 mm. However, the embodiment is not limited thereto, and it is needless to say that various sizes may be designed according to the type and/or number of chips to be disposed and the type of an electronic device.

In addition, since a separate space for fingerprint recognition is not required and it is possible to form to be overlapped with the display unit, a display region of the entire device can be used widely, thereby enhancing user convenience.

The length L2 in one direction of the fingerprint recognition module 100 including the flexible circuit board for chip on film according to the embodiment may have a length of 10% to 70% level of the length L1 in one direction of the substrate according to Comparative Example.

Accordingly, a size of the fingerprint recognition module 100 including the flexible circuit board for chip on film in the electronic device may be reduced in the embodiment. By removing the need for a separate fingerprint recognition space of Comparative Example, not only may the entire display region be enlarged, but also a space for disposing the battery 60 may be enlarged. In addition, the fingerprint recognition module 100 including the flexible circuit board for chip on film according to the embodiment may reduce a plane area, so that a space for mounting other components may be secured.

FIG. 3A is a cross-sectional view showing a flexible circuit board of a fingerprint recognition module according to an embodiment of the present invention, and FIG. 3B is a cross-sectional view showing a fingerprint recognition module including the flexible circuit board of FIG. 3A.

The flexible circuit board chip on film according to the embodiment may include a substrate 110, a wiring pattern layer 120 disposed on the substrate 110, a plating layer 130, and a protective layer 140.

Here, the flexible circuit board for chip on film is a substrate before mounting a first chip C1, a second chip C2, and a third chip C3 that constitute the fingerprint recognition module 100.

The substrate 110 may be a supporting substrate for supporting the wiring pattern layer 120, the plating layer 130, and the protective layer 140.

The substrate 110 may include a bending region and a region other than the bending region. That is, the substrate 110 may include a bending region in which bending is performed and a non-bending region other than the bending region. The bending region may be a region between the first chip C1 and the second chip C2 of an upper surface of the substrate 110. The bending region may be a region excluding a chip disposition region in which the first chip C1, the second chip C2 and the third chip C3 are disposed. In addition, the non-bending region may be a remaining region excluding the bending region. The non-bending region may include a first chip disposition region in which the first chip C1 is disposed, a second chip disposition region in which the second chip C2 is disposed, and a third chip disposition region in which the third chip C3 is disposed.

The substrate 110 may be a flexible substrate. Accordingly, the substrate 110 may be partially bent. That is, the substrate 110 may include a flexible plastic. For example, the substrate 110 may be a polyimide (PI) substrate. However, the embodiment is not limited thereto, and may be a substrate made of a polymer material such as polyethylene terephthalate (PET), polyethylene naphthalate (PEN), or the like. Accordingly, a flexible circuit board including the substrate 110 may be used in various electronic devices having a curved display device. For example, a flexible circuit board including the substrate 110 is excellent in flexible characteristics, thereby having suitability of mounting a semiconductor chip on a wearable electronic device. In particular, the embodiment may be suitable for an electronic device including a curved display.

The substrate 110 may be an insulating substrate. That is, the substrate 110 may be an insulating substrate supporting various wiring patterns.

The substrate 110 may have a thickness of 20 μm to 100 μm. For example, the substrate 110 may have a thickness of 25 μm to 50 μm. For example, the substrate 100 may have a thickness of 30 μm to 40 μm. When the thickness of the substrate 100 exceeds 100 μm, the thickness of the entire flexible circuit board may be increased. When the thickness of the substrate 100 is less than 20 μm, it may be difficult to dispose the first chip C1, the second chip C2, and the third chip C3 at the same time. When the thickness of the substrate 110 is less than 20 μm, the substrate 110 may be vulnerable to heat/pressure in a process of mounting a plurality of chips, and thus it is difficult to dispose the plurality of chips at the same time.

A wiring may be disposed on the substrate 110. The wiring may be a plurality of patterned wirings. For example, the plurality of wirings on the substrate 110 may be disposed to be spaced apart from each other. That is, a wiring pattern layer 120 may be disposed on one surface of the substrate 110.

Preferably, wirings may be disposed on both sides of the substrate 110, respectively. That is, an upper wiring pattern layer may be disposed on the upper surface of the substrate 110, and a lower wiring pattern layer may be disposed on a lower surface. In addition, an upper plating layer may be disposed on the upper wiring pattern layer. Further, an upper protective layer may be disposed on the upper wiring pattern layer. In addition, a lower plating layer may be disposed under the lower wiring pattern layer. Further, a lower protective layer may be disposed under the lower wiring pattern layer.

The wiring pattern layer 120 may include a conductive material.

For example, the wiring pattern layer 200 may include a metal material having excellent electrical conductivity. More specifically, the wiring pattern layer 200 may include copper (Cu). However, the embodiment is not limited thereto, and it is possible to include at least one metal among copper (Cu), aluminum (Al), chromium (Cr), nickel (Ni), silver (Ag), molybdenum (Mo), gold (Au), titanium (Ti), and an alloy thereof.

The wiring pattern layer 120 may be disposed to have a thickness of 1 μm to 15 μm. For example, the wiring pattern layer 120 may be disposed to have a thickness of 4 μm to 10 μm. For example, the wiring pattern layer 120 may be disposed to have a thickness of 6 μm to 9 μm.

When the thickness of the wiring pattern layer 120 is less than 1 μm, a resistance of the wiring pattern layer 120 may increase. When the thickness of the wiring pattern layer 120 exceeds 10 μm, it is difficult to side-etching when using a lithography method, it is difficult to use a mask when using a printing method, and deposition should be performed for a long time in case of a sputtering method, and thus it is difficult to realize a fine pattern.

The plating layer 130 may be disposed on the wiring pattern layer 120. The plating layer 130 may include a first plating layer 131 and a second plating layer 132.

The first plating layer 131 may be disposed on the wiring pattern layer 120, and the second plating layer 132 may be disposed on the first plating layer 131. The first plating layer 131 and the second plating layer 132 may be formed in two layers on the wiring pattern layer 120 in order to prevent formation of whiskers. Accordingly, a short circuit between patterns of the wiring pattern layer 120 may be prevented. In addition, since two plating layers are disposed on the wiring pattern layer 120, bonding characteristics with a chip may be improved. When the wiring pattern layer includes copper (Cu), the wiring pattern layer may not be directly bonded to the first chip C1, and a separate bonding process may be required. On the other hand, when the plating layer disposed on the wiring pattern layer is formed in a single layer, the copper (Cu) of the wiring pattern layer is diffused to the plating layer in a plating process, thereby causing a defect upon bonding with a chip. Since a plating layer of two layers is further formed on the plating layer of one layer, an amount of copper (Cu) on a surface bonded to a chip is none or reduced, thereby facilitating chip bonding. When the plating layer includes tin (Sn), a surface of the plating layer may be a pure tin layer, and thus bonding with the first chip C1 may be facilitated.

A region in which the first plating layer 131 is disposed may correspond to a region in which the second plating layer 132 is disposed. That is, an area in which the first plating layer 131 is disposed may correspond to an area in which the second plating layer 132 is disposed.

Moreover, the region in which the first plating layer 131 is disposed may be larger than the region in which the second plating layer 132 is disposed. Even though the protective layer 140 is formed after the first plating layer 131 is formed, and the second plating layer 132 is formed on the first plating layer on which the protective layer is not formed, it is possible to prevent the whisker phenomenon and Cu diffusion.

The plating layer 130 may include tin (Sn). For example, the first plating layer 131 and the second plating layer 132 may include tin (Sn).

As an example, the wiring pattern layer 120 may be formed of copper (Cu), and the first plating layer 131 and the second plating layer 132 may be formed of tin (Sn). When the plating layer 130 includes tin, corrosion resistance of tin (Sn) is excellent, and thus the wiring pattern layer 120 may be prevented from being oxidized.

Meanwhile, a material of the plating layer 130 may have a lower electrical conductivity than that of the wiring electrode layer 120. The plating layer 130 may be electrically connected to the wiring electrode layer 120.

The first plating layer 131 and the second plating layer 132 may be formed of the same tin (Sn), but may be formed in a separate process.

When the manufacturing process of a flexible circuit board according to the embodiment includes a heat treatment process such as thermal curing, a diffusion action of copper (Cu) of the wiring pattern layer 120 or tin (Sn) of the plating layer 130 may occur. Specifically, the diffusion action of copper (Cu) of the wiring pattern layer 120 or tin (Sn) of the plating layer 130 may occur by curing of the protective layer 140.

Accordingly, as the diffusion concentration of copper (Cu) decreases from the first plating layer 131 to a surface of the second plating layer 132, a content of copper (Cu) may be continuously reduced. Meanwhile, the content of tin (Sn) may continuously increase from the first plating layer 131 to the surface of the second plating layer 132. Accordingly, the uppermost portion of the plating layer 130 may include a pure tin.

That is, the wiring pattern layer 120 and the plating layer 130 may be an alloy of tin and copper due to a chemical action at a stacking interface. The thickness of the alloy of tin and copper after the protective layer 140 is cured on the plating layer 130 may be increased than the thickness of the alloy of tin and copper after the plating layer 130 is formed on the wiring pattern layer 120.

An alloy of tin and copper included in at least a part of the plating layer 130 may have a chemical formula of $Cu_xSn_y$, and may be $0<x+y<12$. For example, in the chemical formula, a sum of x and y may be $4 \leq x+y \leq 11$. For example, the alloy of tin and copper included in the plating layer 130 may include at least one of $Cu_3Sn$ and $Cu_6Sn_5$. Specifically, the first plating layer 131 may be an alloy layer of tin and copper.

In addition, the first plating layer 131 and the second plating layer 132 may have different contents of tin and copper. The first plating layer 131 in direct contact with the copper wiring pattern layer may have a copper content greater than that of the second plating layer 132.

The second plating layer 132 may have a higher tin content than the first plating layer 131. The second plating layer 132 may include a pure tin layer. Here, pure tin may mean that a content of tin (Sn) is 50 atomic % or more, 70 atomic % or more, or 90 atomic % or more. At this time, an element other than tin may be copper. For example, the second plating layer 132 may have a tin (Sn) content of 50 atomic % or more. For example, the second plating layer 132 may have a tin (Sn) content of 70 atomic % or more. For example, the second plating layer 132 may have a tin (Sn) content of 90 atomic % or more. For example, the second plating layer 132 may have a tin (Sn) content of 95 atomic % or more. For example, the second plating layer 132 may have a tin (Sn) content of 98 atomic % or more.

The plating layer according to the embodiment may prevent electrochemical migration resistance due to a diffusion phenomenon of Cu/Sn, and may prevent short-circuit defects due to metal growth.

However, the embodiment is not limited thereto, and the plating layer 130 may include any one of a Ni/Au alloy, gold (Au), electroless nickel immersion gold (ENIG), a Ni/Pd alloy, and organic solderability preservative (OSP).

The first plating layer 131 and the second plating layer 132 may correspond to each other, or have different thicknesses. The total thickness of the first plating layer 131 and the second plating layer 132 may be 0.07 µm to 1 µm. The total thickness of the first plating layer 131 and the second plating layer 132 may be 0.15 µm to 0.7 µm. The total thickness of the first plating layer 131 and the second plating layer 132 may be 0.3 µm to 0.5 µm. Any one plating layer of the first plating layer 131 and the second plating layer 132 may have a thickness of 0.05 µm to 0.15 µm. For example, any one plating layer of the first plating layer 131 and the second plating layer 132 may have a thickness of 0.07 µm to 0.13 µm.

The protective layer 140 may be partially disposed on the wiring pattern layer 120. For example, the protective layer 140 may be disposed on the plating layer 130 on the wiring pattern layer 120. Since the protective layer 140 may cover the plating layer 130, it is possible to prevent damage or delamination of a film caused by oxidation of the wiring pattern layer 120 and the plating layer 130.

The protective layer 140 may be partially disposed in a region excluding a region in which the wiring pattern layer 120 and/or the plating layer 130 is electrically connected to a display panel 30, a main board 40, the first chip C1, the second chip C2, or the third chip C3.

Accordingly, the protective layer 140 may be partially overlapped with the wiring pattern layer 120 and/or the plating layer 130.

An area of the protective layer 140 may be smaller than that of the substrate 110. The protective layer 140 may be disposed in a region excluding an end of the substrate, and may include a plurality of open regions.

The protective layer 140 may include a first open region OA1 having a shape like a hole. The first open region OA1 may be a non-disposing region of the protective layer 140 for electrically connecting the wiring pattern layer 120 and/or the plating layer 130 to the first chip C1. In this case, the wiring pattern layer 120 and/or the plating layer 130 exposed through the first open region OA1 may be referred to as bonding pads to be connected to bumps provided in the first chip C1.

The protective layer 140 may include a second open region OA2 having a shape like a hole. The second open region OA2 may be a non-disposing region of the protective layer 140 for electrically connecting the wiring pattern layer 120 and/or the plating layer 130 to the second chip C2. Accordingly, the plating layer 130 may be exposed to the outside in the second open region OA2.

In the second open region OA2, a copper content of the plating layer 130 may be 50 atomic % or more. For example, the copper content in the plating layer 130 may be 60 atomic % or more. For example, the copper content in the plating layer 130 may be 60 atomic % to 80 atomic %. Specifically, a copper content of the first plating layer 131 measured in the second open region OA2 may be 60 atomic % to 80 atomic %.

The protective layer 140 may include a third open region OA3 shaped like a hole. The third open region OA3 may be a non-disposition region of the protective layer 140 for electrically connecting the wiring pattern layer 120 and/or the plating layer 130 to the third chip C3. Accordingly, in the third open region OA3, the plating layer 130 may be exposed to the outside.

The protective layer 140 may not be disposed on the conductive pattern portion for being electrically connected to the main board 40. The embodiment may include a fourth open region OA4 that is a non-disposition region of the protective layer 140 on the conductive pattern portion to be electrically connected to the main board 40. Accordingly, the plating layer 130 may be exposed to the outside in the fourth open region OA4.

In the fourth open region OA4, a copper content of the plating layer 130 may be 50 atomic % or more. Alternatively, in the fourth open region OA4, a copper content of the plating layer 130 may be less than 50 atomic %. The fourth open region OA3 may be located outside the substrate as compared with the first open region OA1. In addition, the fourth open region OA4 may be located outside the substrate as compared with the second open region OA2. Further, the fourth open region OA4 may be located outside the substrate as compared with the third open region OA3.

The first open region OA1, the second open region OA2, and the third open region OA3 may be located in a central region of the substrate as compared with the fourth open region OA4.

At this time, at least one of two outermost regions in a longitudinal direction of the substrate may be covered by the protective layer 140. In other words, the substrate 110 may include a first outer region and a second outer region. The first outer region may be a left end region of the substrate 110. The second outer region may be a right end region of the substrate 110. In addition, the fourth open region OA4 for connection with the main board as described above is located in the second outer region. On the contrary, the first outer region does not have an open region. In other words, the first outer region may include a protective portion PP on which the protective layer 140 is formed.

The protective layer 140 may be disposed in a bending part BP. Accordingly, the protective layer 140 may disperse stress that may occur during bending. Therefore, reliability of a flexible circuit board for chip on film according to an embodiment may be improved.

In addition, wear of the first outer region of the fingerprint recognition module 100 including the flexible circuit board for chip on film may be prevented due to formation of a protective layer in the first outer region. In case of a flexible circuit board for a chip on film that mounts a conventional drive IC, a terminal connected to a display was formed in a portion corresponding to the first outer region, and accordingly, the first outer region was in contact with a display panel and an exposed portion of the first outer region was protected with an adhesive material such as ACF to prevent wear of the first outer region. However, in case of the present invention, since there is no portion connected to the first outer region, the first outer region may form a separate protective portion PP to prevent wear.

The protective layer 140 may include an insulating material. The protective layer 140 may include various materials that may be heated and cured after being applied to protect the surface of the conductive pattern portion. The protective layer 140 may be a resist layer. For example, the protective layer 140 may be a solder resist layer including an organic polymer material. For example, the protective layer 140 may include an epoxy acrylate resin. In detail, the protective layer 140 may include a resin, a curing agent, a photo initiator, a pigment, a solvent, a filler, an additive, an acrylic monomer, and the like. However, the embodiment is not limited thereto, and it is needless to say that the protective layer 140 may be any one of a photo-solder resist layer, a cover-lay, and a polymer material.

The protective layer 140 may have a thickness of 1 μm to 20 μm. The protective layer 140 may have a thickness of 5 μm to 15 μm. For example, the protective layer 140 may have a thickness of 7 μm to 12 μm. When the thickness of the protective layer 140 exceeds 20 μm, the thickness of the flexible circuit board for chip on film may increase. When the thickness of the protective layer 140 is less than 1 μm, reliability of the conductive pattern portion included in the flexible circuit board for chip on film may be lowered.

After the wiring pattern layer 120, the plating layer 130, and the protective layer 140 are disposed on one surface of the substrate 110 according to the embodiment, the wiring pattern layer 120, the plating layer 130, and the protective layer 140 are disposed on the other surface opposite to the one surface of the substrate 110.

That is, an upper wiring pattern layer, an upper plating layer, and an upper protective layer may be disposed on one surface of the substrate 110 according to the embodiment, and a lower wiring pattern layer, a lower plating layer, and a lower protective layer are disposed on the other surface opposite to the one surface of the substrate 110.

The upper wiring pattern layer may include a metal material corresponding to the lower wiring pattern layer. Accordingly, process efficiency may be improved. However, it is needless to say that the embodiment is not limited thereto, and may include other conductive materials.

A thickness of the upper wiring pattern layer may correspond to a thickness of the lower wiring pattern layer. Accordingly, process efficiency may be improved.

The upper plating layer may include a metal material corresponding to the lower plating layer. Accordingly, process efficiency may be improved. However, it is needless to say that the embodiment is not limited thereto, and may include other conductive materials.

A thickness of the upper plating layer may correspond to a thickness of the lower plating layer. Accordingly, process efficiency may be improved.

The substrate 110 may include a through-hole. The substrate 110 may include a plurality of through-holes. The plurality of through-holes of the substrate 110 may be formed individually or simultaneously by a mechanical process or a chemical process. For example, the plurality of through-holes of the substrate 110 may be formed by a drilling process or an etching process. As an example, the through-holes of the substrate may be formed through laser punching and desmearing processes. The desmearing process may be a process of removing a polyimide smear attached to an inner surface of the through-hole. By the desmearing process, an inner surface of the polyimide substrate may have an inclined surface similar to a straight line.

The wiring pattern layer 120, the plating layer 130, and the protective layer 140 may be disposed on the substrate 110. In detail, the wiring pattern layer 120, the plating layer 130, and the protective layer 140 may be sequentially disposed on both surfaces of the substrate 110.

The wiring pattern layer 120 may be formed by at least one method of evaporation, plating, and sputtering.

As an example, a wiring layer for forming a circuit may be formed by electrolytic plating after sputtering. For example, a wiring layer for forming a circuit may be a copper plating layer formed by electroless plating. Alternatively, the wiring layer may be a copper plating layer formed by electroless plating and electrolytic plating.

Next, a patterned wiring layer may be formed on both surfaces of a flexible circuit board, that is, on the upper and lower surfaces, after laminating a dry film on the wiring layer, through the processes of exposure, development, and etching. Accordingly, the wiring pattern layer 120 may be formed.

Conductive materials may be filled in via holes V1, V2, V3, and V4 passing through the substrate 110. The conductive material filled in a via hole may correspond to the wiring pattern layer 120, or may be different conductive materials. For example, the conductive material filled in a via hole may include at least one metal among copper (Cu), aluminum (Al), chromium (Cr), nickel (Ni), silver (Ag), molybdenum (Mo), gold (Au), titanium (Ti), and an alloy thereof. The electrical signal of the conductive pattern portion CP on the upper surface of the substrate 110 may be transmitted to the conductive pattern portion CP of the lower surface of the substrate 110 through the conductive material filled in a via hole.

Moreover, by forming a via and a wiring on the substrate, the same material as the wiring may be formed in the via in the same process. Through this, a process of separately filling the via with a conductive material may be eliminated, and a signal transmission/distortion phenomenon due to a material difference between the via and the wiring may be reduced.

Next, a plating layer 130 may be formed on the wiring pattern layer 120.

Thereafter, a protective portion PP may be screen printed on the conductive pattern portion CP.

The conductive pattern portion CP may include the wiring pattern layer 120 and the plating layer 130. The area of the wiring pattern layer 120 may correspond to or be different from that of the plating layer 130. The area of the first plating layer 131 may correspond to or different from that of the second plating layer 132.

Referring to FIG. 3A, the area of the wiring pattern layer 120 may correspond to the plating layer 130. The area of the first plating layer 131 may correspond to the area of the second plating layer 132.

Referring to FIG. 5, the area of the wiring pattern layer 120 may be different from that of the plating layer 130. The area of the wiring pattern layer 120 may correspond to the area of the first plating layer 131. The area of the first plating layer 131 may be different from that of the second plating layer 132. For example, the area of the first plating layer 131 may be larger than that of the second plating layer 132.

Referring to FIG. 6, the area of the wiring pattern layer 120 may be different from that of the plating layer 130.

Referring to FIG. 7, the area of the wiring pattern layer 120 on one surface of the substrate 110 is different from that of the plating layer 130, and the area of the wiring pattern layer 120 on the other surface of the substrate 110 may correspond to the area of the plating layer. 130.

The protective layer 140 may be disposed on the substrate 110 in direct contact, disposed on the wiring pattern layer 120 in direct contact, or disposed on the first plating layer 131 in direct contact. or disposed on the second plating layer 132 in direct contact.

Referring to FIGS. 3A to 3B, the first plating layer 131 may be disposed on the wiring pattern layer 120, the second plating layer 132 may be formed on the first plating layer 131, and the protective layer 140 may be partially disposed on the second plating layer 132.

Referring to FIG. 5, the first plating layer 131 may be disposed on the wiring pattern layer 120, and the protective layer 140 may be partially disposed on the first plating layer 131. The second plating layer 132 may be disposed in a region other than a region in which the protective layer 140 is disposed on the plating layer 131.

The first plating layer 131 in contact with a lower surface of the protective layer 140 may be an alloy layer of copper and tin. The second plating layer 132 contacting a side surface of the protective layer 140 may include pure tin. Accordingly, it is possible to prevent delamination of the protective layer and formation of whiskers by formation of a hollow portion between the protective layer 140 and the first plating layer 131, thereby increasing adhesion of the protective layer. Therefore, the embodiment may include two layers of plating layers, and thus an electronic device with high reliability may be provided.

In addition, when only the single-layered tin plating layer 131 is disposed on the wiring pattern layer 120, and when the protective layer 140 is disposed on one tin plating layer 131, the tin plating layer 131 is heated when the protective layer 140 is thermally cured, and thus copper may diffuse into the tin plating layer 131. Accordingly, since the tin plating layer 131 may be an alloy layer of tin and copper, there is a problem that the first chip having a gold bump may be not firmly mounted. Therefore, the plating layer 130 according to the embodiment requires the first plating layer 131 and the second plating layer 132 that may continuously increase a tin concentration as a distance from the substrate increases.

Referring to FIG. 5, the first plating layer 131 may be disposed on the wiring pattern layer 120, and the protective layer 140 may be partially disposed on the first plating layer 131. The second plating layer 132 may be disposed in a region other than the region in which the protective layer 140 is disposed on the plating layer 131.

At this time, the wiring pattern layer 120 may include a first wiring pattern layer 121 and a second wiring pattern layer 122. That is, a plurality of wiring pattern layers may be disposed on the substrate.

In addition, although not shown in drawings, a metal seed layer for improving adhesion between the substrate 110 and the first wiring pattern layer 121 may be further included between the substrate 110 and the first wiring pattern layer 121. At this time, the metal seed layer may be formed by sputtering. The metal seed layer may include copper.

The first wiring pattern layer 121 and the second wiring pattern layer 122 may correspond to each other, or may be formed in different processes.

The first wiring pattern layer 121 may be formed by sputtering copper in a thickness of 1 μm to 15 μm. The first wiring pattern layer 121 may be disposed at upper and lower portions of the substrate and an inner side surface of the through-hole. At this time, since the first wiring pattern layer 121 is thin, the inner side surface of the through-hole may be spaced apart from each other.

Next, the second wiring pattern layer 122 may be disposed on the first wiring pattern layer 121. In addition, the second wiring pattern layer 122 may be entirely filled in the through-hole by plating.

Since the first wiring pattern layer 121 is formed by sputtering, the first wiring pattern layer 121 has an advantage of excellent adhesion to the substrate 110 or the metal seed layer, but a manufacturing cost is high, and thus the manufacturing cost may be reduced by forming again the second wiring pattern layer 122 on the first wiring pattern layer 121 by plating. In addition, the second wiring pattern layer 122 may be disposed on the first wiring pattern layer 121 and at the same time, the via hole may be filled with copper without separately filling the through-hole of the substrate with a conductive material, thereby improving process efficiency. Further, since it is possible to prevent voids from being formed in the via hole, a highly reliable flexible circuit board for chip on film and an electronic device including the same may be provided.

Referring to FIG. 7, a plurality of protective layers 140 may be disposed on one surface of the substrate. The protective layer may include a first protective layer 141 and a second protective layer 142.

For example, the first protective layer 141 may be partially disposed on one surface of the substrate, and the wiring pattern layer 120 may be disposed on a region other than the region in which the protective layer 141 is disposed.

The second protective layer 142 may be disposed on the protective layer 141. The second protective layer 142 may cover the first protective layer 141 and the wiring pattern layer 120, and may be disposed in a larger region than the first protective layer 141.

The protective layer 142 may be disposed on a region corresponding to the protective layer 141 while surrounding an upper surface of the first protective layer 141. A width of the second protective layer 142 may be larger than that of the protective layer 141. Accordingly, a lower surface of the second protective layer 142 may be in contact with the wiring pattern layer 120 and the first protective layer 141. Accordingly, the second protective layer 142 may relieve stress concentration at an interface between the first protective layer 141 and the wiring pattern layer 120. Therefore, when bending the flexible circuit board for chip on film according to the embodiment, it is possible to reduce an occurrence of delamination of a film or cracks.

The first and second protective layers may use the same material. Through this, the protective layers may be formed to have a step on the plating layer. Due to formation of the step, it is possible to prevent delamination of the protective layer and formation of whiskers by formation of a hollow portion between the protective layer 140 and the first plating layer 131, thereby increasing adhesion of the protective layer.

The plating layer 130 may be disposed in a region other than the region in which the second protective layer 142 is disposed. Specifically, the first plating layer 131 may be disposed on the wiring pattern layer 120 in a region other than the region in which the second protective layer 142 is disposed, and the second plating layer 132 may be disposed on the first plating layer 131 in order.

The wiring pattern layer 120 may be disposed on the other surface opposite to the one surface of the substrate. The plating layer 130 may be disposed on the wiring pattern layer 120. The protective layer 140 may be partially disposed on the plating layer 130.

Widths of the protective layer disposed on one surface of the substrate and the protective layer disposed on the other surface of the substrate may correspond to each other or may be different from each other.

In the drawing, it is shown that a plurality of protective layers are disposed only on one surface of the substrate, but the embodiment is not limited thereto, and it is needless to say that the plurality of protective layers may be included on both surfaces of the substrate. In addition, it is needless to say that a plurality of or one protective layer may be disposed only on one surface of the substrate.

Meanwhile, the flexible circuit board for chip on film according to the embodiment as described above may include a substrate 110, a conductive pattern portion CP disposed on one surface of the substrate, and a protective portion PP formed by partially disposing a protective layer 140 in one region on the conductive pattern portion CP.

The conductive pattern portion CP may include the wiring pattern layer 120 and the plating layer 130.

The protective portion PP may not be disposed on one region and another region on the conductive pattern portion CP. Accordingly, the conductive pattern portion CP and the substrate 110 between the separated conductive pattern portions CP may be exposed on the one region and the other region on the conductive pattern portion CP. A first connection portion 150, a second connection portion 160, and a third connection portion 170 may be disposed on the one region and the other region on the conductive pattern portion CP, respectively. Specifically, the first connection portion 150, the second connection portion 160, and the third connection portion 170 may be disposed on an upper surface of the conductive pattern portion CP in which the protective portion PP is not disposed, respectively.

Each of the first connection portion 150, the second connection portion 160, and the third connection portion 170 may have different shapes.

For example, the first connection portion 150 may be an adhesive. For example, the first connection portion 150 may be an adhesive paste. For example, the first connection portion 150 may be an anisotropic conductive adhesive. For example, the first connection portion 150 may be an anisotropic conductive film (ACF) or an anisotropic conductive paste (ACP) having conductive particles disposed therein.

For example, the second connection portion 160 may include a spherical shape. A cross-section of the second connection portion 160 may include a circular shape. Alternatively, the second connection portion 160 may include a partially or wholly rounded shape. As an example, the cross-sectional shape of the second connection portion 160 may include a flat surface on one side surface and a curved surface on the other side surface opposite to the one side surface.

The third connection portion 170 may include a spherical shape. A cross-section of the third connection portion 170 may include a circular shape. Alternatively, the third connection portion 170 may include a partially or wholly rounded shape. As an example, the cross-sectional shape of the third connection portion 170 may include a flat surface on one side surface and a curved surface on the other side surface opposite to the one side surface.

The first connection portion 150, the second connection portion 160, and the third connection portion 170 may have different sizes. Widths of the first connection portion 150, the second connection portion 160, and the third connection portion 170 may be different from each other. The first chip C1 may be disposed on the first connection portion 150.

The first connection portion 150 may include conductive particles. Accordingly, the first connection portion 150 may electrically connect the first chip C1 disposed on an upper surface of the first connection portion 150 and the conductive pattern portion CP disposed on a lower surface of the first connection portion 150.

The second chip C2 may be disposed on the second connection portion 160. The second connection portion 160 may include a conductive material. Accordingly, the second connection portion 160 may electrically connect the second chip C2 disposed on an upper surface of the second connection portion 160 and the conductive pattern portion CP disposed on a lower surface of the second connection portion 160.

The third chip C3 may be disposed on the third connection portion 170. The third connection portion 170 may include a conductive material. Accordingly, the third connection portion 170 may electrically connect the third chip C3 disposed on an upper surface of the third connection portion 170 and the conductive pattern portion CP disposed on a lower surface of the third connection portion 170.

Different types of the first chip C1, the second chip C2, and the third chip C3 may be disposed on the same one surface of the flexible circuit board for chip on film according to the embodiment. Specifically, one first chip C1, one second chip C2, and a plurality of third chips C3 may be disposed on the same one surface of the flexible circuit board for chip on film according to the embodiment. Accordingly, efficiency of a chip packaging process may be improved.

However, in the embodiment, the bonding method of the first chip C1 may be different from the bonding method of the second chip C2 and the third chip C3. For example, the first chip C1 may be mounted on the substrate 110 by applying the low-temperature bonding method and using the first connection portion 150 such as an anisotropic conductive adhesive. Alternatively, the second chip C2 and the third chip C3 may be mounted on the substrate 110 at a high temperature of 250° C. or higher through the eutectic bonding method.

The first chip C1 may include a fingerprint recognition sensor. Preferably, the first chip C1 may include an ultrasonic fingerprint recognition sensor. Preferably, the first chip C1 may include a transducer. The transducer constitutes an ultrasonic fingerprint sensor, which is a kind of fingerprint recognition sensor, and its principle is to acquire a fingerprint image by projecting ultrasonic waves on a finger placed on a contact surface and converting reflected sound waves into electric signals. Accordingly, the first chip C1 may include a transducer that converts sound waves reflected by a finger into electrical signals.

To this end, the first chip C1 may include a polymer compound, and may convert a sound wave reflected by a finger into an electrical signal according to an oscillation method.

The second chip C2 may include an application specific integrated circuit (ASIC). The ASIC may receive a control signal transmitted via a main board 40 to transmit it to the first chip C1, or may perform analog processing on the signal acquired via the first chip C1 to transmit the signal to the main board 40.

The third chip C3 may include at least one of a diode chip, a multilayer ceramic capacitor (MLCC) chip, a ball grid array (BGA) chip, and a chip condenser.

The plurality of third chips C3 disposed on the flexible circuit board for chip on film may mean that at least one of a diode chip, an MLCC chip, a BGA chip, and a chip condenser is disposed in plural. As an example, a plurality of MLCC chips may be disposed on the flexible circuit board for chip on film.

In addition, the third chip C3 may include at least two of the diode chip, the power supply IC chip, the touch sensor IC chip, the MLCC chip, the BGA chip, and the chip condenser. That is, a plurality of different types of third chips C3a and C3b may be disposed on the flexible circuit board for chip on film. For example, the third chip C3a of any one of the diode chip, the MLCC chip, the BGA chip, and the chip condenser and one third chip C3b different from the any one of the diode chip, the MLCC chip, the BGA chip, and the chip condenser may be included on the flexible circuit board for chip on film.

In the embodiment, a type of the third chip is not limited thereto, and all the various sub-chips for operational reliability of the first chip C1 and the second chip C2 may be included in the third chip.

Meanwhile, the first chip C1 may be mounted on the first connection portion 150. In this case, the first chip C1 may include bumps B1 and B2 disposed on the lower surface thereof. In this case, the bumps B1 and B2 may include gold (Au). The bumps B1 and B2 may be gold bumps.

The first connection portion 150 may include an anisotropic conductive paste (ACP) or an anisotropic conductive film (ACF), and accordingly, the bumps B1 and B2 of the first chip C1 and the conductive pattern portion exposed through the first open region OA1 may be electrically connected.

Meanwhile, the first connection portion 150 may extend not only in a region between the conductive pattern portion and the bumps B1 and B2, but also extend therefrom and extend to the side surface of the first chip C1. That is, the first connection portion 150 may be formed to surround the side surface of the first chip C1. Accordingly, the first connection portion 150 in the embodiment may omit a side molding process that is essential to be included in a general chip package. In other words, the first connection portion 150 in the embodiment not only functions as an adhesive for mounting the first chip C1 on the conductive pattern portion, but also a protection function of surrounding the first chip C1 and protecting it from an external environment may be additionally provided.

That is, the first connection portion 150 allows the operation reliability of the first chip C1 to be secured from various contamination factors in the environment in which the fingerprint recognition module is used. In this case, the first connection portion 150 is not disposed in a lower region of the first chip C1. Preferably, the first connection portion 150 is disposed in a region between the bumps B1 and B2 and the conductive pattern portion, and is not disposed in a space between the substrate 110 and the first chip C1 except for this.

Accordingly, the first connection portion 150 provides an adhesive force for attaching the first chip C1 to the substrate 110 and seals the periphery of the lower region of the first chip C1. Therefore, a space is formed between the substrate 110 and the first chip C1 in the lower region of the first chip C1. The space is formed for vibration generated during operation of the first chip C1. That is, the first chip C1 is an ultrasonic fingerprint sensor, and accordingly, the vibration is generated during operation. Therefore, the space secures a space in which the vibration of the first chip C1 is stably generated.

At this time, when the space is too wide, there is a problem in that the entire volume of the fingerprint recognition module is increased, and when the space is too narrow, a problem may occur in operational reliability of the first chip C1 due to the contact between the first chip C1 and the substrate 110 during operation of the fingerprint recognition sensor.

Therefore, a height of the space should be set between 7 μm and 12 μm. In addition, the height of the space should be set between 8 μm and 10 μm. Preferably, the height of the space should be set at least 7 μm. That is, when the height of the space is less than 7 μm, a problem may occur that the vibration space of the first chip C1 is not sufficiently secured. Accordingly, in the present invention, thickness ranges of the wiring pattern layer 120, the first plating layer 131, and the second plating layer 132 described above are adjusted so that a height of the conductive pattern portion is at least 7 μm or more. However, it is not easy to control the height of the space only by adjusting the thickness of the conductive pattern portion.

At this time, conductive particles 151 are disposed in the first connection portion 150 in the present embodiment. In addition, a certain space may be formed between the bumps B1 and B2 and the conductive pattern portion by the conductive particles 151, and thus a vibration space of the first chip C1 may be easily secured.

Meanwhile, a chip protection layer 153 is disposed on a lower surface of the first chip C1. The chip protection layer 153 is formed between the first chip C1 and the substrate to protect the first chip C1 from contact between the first chip C1 and the substrate.

Meanwhile, a second connection portion 160 is disposed in the second open region OA2 of the flexible circuit board for chip on film.

In order to dispose the second chip C2 on the flexible circuit board for chip on film according to the embodiment, heat may be selectively applied only to a portion corresponding to a region in which the second connection portion 160 is disposed via a mask (not shown). Specifically, in the embodiment, heat may be selectively supplied to the region in which the second connection portion 160 for connecting the second chips C2 is disposed through a selective reflow process. Specifically, in the flexible circuit board for chip on film according to the embodiment, heat may be partially supplied through the selective reflow process even when the second chip C2 is disposed after the first chip C1 is mounted.

That is, a manufacturing process according to the embodiment may prevent the first open region OA from being exposed to heat through the mask. Accordingly, it is possible to prevent that the second plating layer disposed at the first open region OA1 from being modified from a pure tin layer to an alloy layer of tin and copper by supplying heat. Accordingly, even when the first chip C1 and the second chip C2 which are different from each other are mounted on one flexible circuit board 100 for chip on film, the tin (Sn) content of the second plating layer 132a may be 50 atomic % or more in the first open region, and thus assembly of the drive IC chip may be excellent.

The second connection portion 160 may include gold (Au), but preferably, the second connection portion 160 may include a metal other than gold (Au). Accordingly, the second connection portion 160 may be excellent in assembly performance with the second chip C2 even when the second plating layer 132 located under the second connection portion 160 is not a pure tin layer. In addition, the second connection portion 160 may include a metal other than gold (Au), and thus a manufacturing cost may be reduced.

For example, the second connection portion 160 may include at least one of copper (Cu), tin (Sn), aluminum (Al), zinc (Zn), indium (In), lead (Pb), antimony (Sb), bismuth (bi), silver (Ag), and nickel (Ni).

The second connection portion 160 may be a solder bump. The second connection portion 160 may be a solder ball. The solder ball may be melted at a temperature of the reflow process.

In order to dispose one second chip C2 on the flexible circuit board for chip on film according to the embodiment, a plurality of the second connection portions 80 may be disposed between the second chip C2 and the second plating layer 132.

At the temperature of the reflow process, the second chip C2 may be bonded excellently with the second plating layer 132 on the second open region OA2 via the second connection portion 160.

In the flexible circuit board for chip on film according to the embodiment, connection of the first chip C1 may be excellent via the first connection portion 70 in the first open region, and connection of the second chip C2 may be excellent via the second connection portion 160 in the second open region.

Meanwhile, a side molding portion 164 may be disposed around the second chip C2. The side molding portion 164 allows operational reliability of the second chip C2 to be secured from various contamination factors. In this case, the side molding portion 164 may not be disposed in a lower region of the second chip C2. In addition, otherwise, the side molding portion 164 may be disposed while filling the entire lower region of the second chip C2. Therefore, the side molding portion 164 may improve the mounting robustness of the second chip C2.

That is, bonding is performed on the first chip C1 using the first connection portion 150, which also functions as a side molding portion using an anisotropic conductive adhesive. In contrast, the second chip C2 is bonded using the second connection portion 160 such as a solder bump, and then an additional molding process is performed using the side molding portion 164.

Meanwhile, a third connection portion 170 is disposed in the third open region OA3 of the flexible circuit board for chip on film.

In order to dispose the third chip C3 on the flexible circuit board for chip on film according to the embodiment, heat may be selectively applied only to a portion corresponding to a region in which the third connection portion 170 is disposed via a mask (not shown). Specifically, in the embodiment, heat may be selectively supplied to the region in which the third connection portion 170 for connecting the third chip C3 is disposed through a selective reflow process.

The third connection portion 170 may include a metal other than gold (Au). Accordingly, the third connection portion 170 may be excellent in assembly performance with the third chip C3 even when the second plating layer 132 located under the third connection portion 170 is not a pure tin layer. In addition, the third connection portion 170 may include a metal other than gold (Au), and thus a manufacturing cost may be reduced.

For example, the third connection portion 170 may include at least one of copper (Cu), tin (Sn), aluminum (Al), zinc (Zn), indium (In), lead (Pb), antimony (Sb), bismuth (bi), silver (Ag), and nickel (Ni).

Meanwhile, a distance between the first chip C1 and the second chip C2 is spaced apart by a first distance W1, and a distance between the second chip C2 and the third chip C3 is spaced apart by a second distance W2. That is, the distance between the first chip C1 and the second chip C2 is spaced apart by the first distance W1, thereby minimizing possibility of cracks occurring during bending.

That is, a bending region is included between the first chip C1 and the second chip C2. More specifically, a first non-bending region adjacent to the first chip C1, a second non-bending region adjacent to the second chip C2, and a bending region between the first non-bending region and the second non-bending region are included between the first chip C1 and the second chip C2.

In this case, a width of the bending region may be determined by a thickness of the substrate 110 or a thickness of the conductive pattern portion CP. At this time, when the distance between the first chip C1 and the second chip C2 is too narrow, widths of the first and second non-bending regions may be narrowed. In this case, when the substrate is bent, damage may be applied to the mounted first chip C1 or the second chip C2, and thus cracks of the bonding portion may occur. Therefore, the distance between the first chip C1 and the second chip C2 should have a minimum distance so that the cracks may not occur. At this time, after bending, a distance W3 between the first chip C1 and a bent end should be at least 1.6 mm to prevent the occurrence of the cracks. In addition, after bending, a distance between the second chip C2 and the bent end should be at least 1.6 mm to prevent the occurrence of the cracks. Therefore, the distance W1 between the first chip C1 and the second chip C2 is set at least 3.2 mm. Here, the distance between the bent end and the first chip C1 may refer to a distance from an end of a substrate located at the rightmost to a right end of the first chip C1 after the substrate is bent. Here, the distance between the second chip C2 and the bent end may refer to a distance from the end of the substrate located at the rightmost to a left end of the second chip C2 after the substrate is bent. In addition, when the distance W1 between the first chip C1 and the second chip C2 exceeds 10 mm, a loss may occur in an output signal of the first chip C1 received from the second chip C2. The distance W1 between the first chip C1 and the second chip C2 is set to have a range between 3.2 mm and 10 mm. For example, the distance W1 may be between 3.2 mm and 5 mm. For example, the distance W1 may be between 3.2 mm and 3.6 mm.

In addition, the closer the distance between the second chip C2 and the third chip C3, the more advantageous in signal processing. That is, when the distance between the second chip C2 and the third chip C3 increases, a signal wiring length increases correspondingly, and a loss in signal transmission occurs due to an increase in wiring resistance. However, when the distance between the second chip and the third chip C3 is too close, a reliability problem may occur in a mounting process between the second chip C2 and the third chip C3. That is, in general, after the second chip C2 is mounted, the mounting process of the third chip C3 is performed. At this time, when the distance between the second chip C2 and the third chip C3 is too close, during bonding the third chip C3, a phenomenon in which the second connection portion 160 that has been bonded melts occurs, and accordingly, a problem that the position of the second chip C2 is displaced occurs. Therefore, the distance W2 between the second chip C2 and the third chip C3 is set to be at least 1.0 mm so that the problem that may occur may be solved. In addition, when the distance W2 between the second chip C2 and the third chip C3 exceeds 5 mm, a loss in the signal between the second chip C2 and the third chip C3 may occur. The distance W2 between the second chip C2 and the third chip C3 is set to have a range between 1.0 mm and 5 mm.

For example, the distance W2 may be between 1.0 mm and 3 mm. For example, the distance W2 may be between 1.0 mm and 1.5 mm.

That is, the distance W2 may be smaller than the distance W1 between the first chip C1 and the second chip C2. Through this, it is possible to form a flexible circuit board capable of bending while minimizing signal loss.

Meanwhile, as described above, a flexible circuit board includes a bending region. Accordingly, the flexible circuit board includes a first non-bending region of the flexible circuit board located on one side of the bending region and a second non-bending region of the flexible circuit board located on the other side of the bending region. At this time, an adhesive layer 180 may be disposed between the first non-bending region and the second non-bending region. The adhesive layer 180 allows to maintain a bending shape of the flexible circuit board. In addition, a shielding film (not shown) for shielding electromagnetic waves may be disposed on a surface of the adhesive layer 180. The shielding film may shield electromagnetic waves while suppressing signal interference between the first chip C1 disposed in the first non-bending region and the second chip C2 and third chip C3 disposed in the second non-bending region.

Referring to FIG. 8A, a first chip C1 mounted on the flexible circuit board for chip on film may contact a display panel 30. Preferably, an adhesive layer 50 may be disposed on an upper surface of the first chip C1. In addition, the first chip C1 may be attached to a lower surface of the display panel 30 by the adhesive layer 50. Through this, a device capable of securing an effective region of a display as much as possible may be manufactured.

In addition, referring to FIG. 8B otherwise, the first chip C1 mounted on the flexible circuit board for chip on film may contact a cover window 70 located on the display panel 30. Preferably, at least one region of the cover window 70 may not be overlapped vertically with the display panel 30.

Preferably, at least one region of the cover window 70 may include an ineffective region in which an image is not displayed, and accordingly, the first chip C1 may be attached under the ineffective region of the cover window 70.

Accordingly, the display panel 30 or the cover window 70 and the flexible circuit board for chip on film (clearly, the first chip) may be bonded vertically with the adhesive layer 50 interposed therebetween. Through this, it is possible to minimize distortion of a fingerprint signal transmitted via the display.

Meanwhile, the cover window 70 may be a glass film.

One end of the flexible circuit board for chip on film 100 may include a protective portion PP. In other words, since one end of the flexible circuit board for chip on film 100 is not required to be connected to an external substrate or a chip, the one end may be entirely covered by a protective layer, and accordingly, the conductive pattern portion is not exposed to the outside. Since a terminal that exposes the conductive pattern portion is not required at the one end, it is possible to minimize a length of the flexible circuit board for chip on film 100, and to secure a space for mounting other components such as a battery.

The other end opposite to the one end of the flexible circuit board 100 for chip on film may be connected to a main board 40. The other end opposite to the one end of the flexible circuit board 100 for chip on film may be connected to the main board 40 by an adhesive layer 50. Specifically, the main board 40 may be disposed on the upper surface of the adhesive layer 50, and the flexible circuit board for chip on film may be disposed on the lower surface of the adhesive layer 50. Accordingly, the main board 40 and the flexible circuit board for chip on film may be bonded vertically with the adhesive layer 50 interposed therebetween. The adhesive layer 50 located between the main board 40 and the flexible circuit board for chip on film may include a conductive material. The adhesive layer 50 may be formed by dispersing conductive particles in an adhesive material. For example, the adhesive layer 50 may be an anisotropic conductive film (ACF). Accordingly, the adhesive layer 50 may transmit electrical signals between the flexible circuit board for chip on film, and the main board 40, and may stably connect other components.

Meanwhile, otherwise, the adhesive layer 50 disposed on the first chip C1 may include a PET-based transparent adhesive layer as an optical clear adhesive (OCA).

Meanwhile, as shown in FIG. 8C, a second substrate 20 may be additionally disposed between the flexible circuit board for chip on film and the main board 40. The second substrate 20 may be disposed between the main board and the flexible circuit board for chip on film in order to provide additional signal processing, a function of recognizing a touch signal according to a movement of a stylus pen or hand on the display, or additional functions other than the fingerprint recognition function such as a drive IC processing a signal of the display. The second substrate 20 may have a configuration including an insulating substrate 21, a conductive pattern portion 22, a protective layer 23, and a reinforcement portion 24 for securing strength. Through this, it is possible to perform processing on one substrate without separately configuring a substrate for processing a fingerprint recognition signal, a touch signal, or a display signal.

Meanwhile, the attachment of the first chip C1 will be described in more detail with reference to FIGS. 3C to 3E.

Referring to FIG. 3C to 3E, the conductive pattern portion CP may be exposed to the outside in a region where the protective layer 140 is not disposed. In addition, the first connection portion 150 may be disposed on the exposed conductive pattern portion CP.

The first connection portion 150 may be disposed between the conductive pattern portion CP and the bumps B1 and B2 of the first chip C1.

In this case, the first connection portion 150 may be disposed not only in the region between the conductive pattern portion CP and the bumps B1 and B2 of the first chip C1, but also in the region between them. In other words, the first chip C1 includes a plurality of bumps B1 and B2. In addition, the protective layer 140 may partially expose the conductive pattern portion CP to be connected to the plurality of bumps B1 and B2, respectively.

Here, the first connection portion 150 may be disposed not only in the region between the conductive pattern part CP and the plurality of bumps B1 and B2, but also in a region between the substrate 100 and the first chip C1 corresponding to a region between the plurality of conductive pattern portions.

In other words, the first connection portion 150 may be disposed to have a closed loop shape on the conductive pattern portion CP. Accordingly, the coupling force between the first connection portion 150 and the substrate 110 may be improved.

On the other hand, when the first chip C1 is compressed in a state in which the first connection portion 150 is disposed, the conductive particles 151 in the first connection portion 150 may be disposed between the conductive particles 151 and the bumps B1, B2. In addition, the conductive pattern portion CP and the bumps B1 and B2 of the first chip C1 may be electrically connected to each other by the conductive particles 151.

In this case, the first connection portion 150 is also disposed in a region other than between the conductive pattern portion CP and the bumps B1 and B2. However, since the conductive particles 151 are separated from each other in a region other than the region between the conductive pattern portion CP and the bumps B1 and B2, electrical connection is not made in this region. Therefore, in the embodiment, even if the first connection portion 150 is disposed to surround the region where the first chip C1 is to be disposed in a closed loop shape, each of the conductive pattern portions and each of the bumps B1 and B2 may be electrically connected 1:1.

To explain this more specifically, a plurality of conductive pattern portions CP adjacent to each other and exposed on a region where the first chip C1 is to be disposed may be disposed on the substrate 110. In addition, the first connection portion 150 is disposed not only on the plurality of conductive pattern portions CP, but also in a region between the plurality of conductive pattern portions CP.

At this time, the conductive particles 151 disposed in the first connection portion 150 between the plurality of conductive pattern portions CP and the bumps B1 and B2 are compressed during the attachment process of the first chip C1. Accordingly, the conductive pattern portion CP and the bumps B1 and B2 are electrically connected. However, the conductive particles 151 disposed between the conductive pattern portions CP are not compressed during the above process, thereby maintaining a state separated from each other. Accordingly, the plurality of conductive pattern portions may be insulated without being electrically connected to each other. In other words, the first connection portion 150 may be disposed also between the plurality of conductive pattern parts. However, since the conductive particles 151 in this region are disposed to be separated from each other, the plurality of conductive pattern portions may be insulated from each other.

Meanwhile, the first connection portion 150 may have a first width D1 and may be disposed between the first chip C1 and the conductive pattern portion CP. In this case, the first width D1 may mean a width in a horizontal direction of the first connection portion 150. The first width D1 may have a range of 0.05 mm to 5 mm. When the first width D1 is smaller than 0.05 mm, bonding reliability of the first chip C1 may be reduced. When the first width D1 is greater than 5 mm, a part of the first connection portion 150 may penetrate into a sensing available region SAR, which is a lower region of the first chip C1 in the bonding process of the first connection portion 150.

Accordingly, the first connection portion 150 may be extended with a second width D2 in a horizontal direction from the outer surface of the first chip C1, and may be extended with a certain width in the vertical direction. In this case, the width in the vertical direction of the first connection portion 150 extending from the lower surface of the first chip C1 may have a fourth width D4. In this case, the fourth width D4 may be determined by the thickness of the first chip C1. For example, the fourth width D4 may be 20% to 90% of the thickness of the first chip C1.

Meanwhile, the first chip C1 may be disposed to be spaced apart from the substrate 110 by a third width D3. That is, a vertical distance from the lower surface of the first chip C1 to the upper surface of the substrate 110 may be the third width D3. In this case, the third width D3 may be 0.01 mm to 1.00 mm.

Also, the sensing available region SAR in the lower region of the first chip C1 may be spaced apart from inner surfaces of the bumps B1 and B2 by a fifth width D5. The fifth width D5 may be determined by the specification of the first connection portion 150 and may be, for example, 0.01 mm to 0.5 mm.

Meanwhile, in the embodiment, the bumps B1 and B2 may include a portion in contact with the first connection portion 150 and a portion not in contact with the first connection portion 150. In other words, the first connection portion 150 may be selectively disposed only on a first lower surface of the lower surfaces of the bumps B1 and B2. Accordingly, a second lower surface of the bumps B1 and B2 excluding the first lower surface may not come into contact with the first connection portion 150. The second lower surface may be a portion adjacent to the sensing available region SAR among lower surfaces of the bumps B1 and B2. This is to prevent a part of the first connection portion 150 from penetrating into the sensing available region SAR during the bonding process of the first connection portion 150, furthermore, this is to allow the first connection portion 150 to extend to the side surface of the first chip C1. In this case, the width of the second lower surface may have a sixth width D6. The sixth width D6 may be 0.01 mm to 0.5 mm.

As described above, the first connection portion 150 in the embodiment is made of an anisotropic conductive adhesive, and may include, for example, an anisotropic conductive film or an anisotropic conductive paste.

In addition, the first connection portion 150 is disposed on the substrate 110 to have a closed-loop shape in the region where the first chip C1 is to be disposed, and accordingly, in the bonding process, the first chip C1 may be extended to a side surface and formed to surround the first chip C1.

In addition, the first connection portion 150 does not contact an entire region of the lower surfaces of the bumps B1 and B2 and does not contact the lower surfaces of the bumps B1 and B2 adjacent to the sensing available region SAR. Thus, a part of the first connection portion 150 is prevented from penetrating into the sensing available region SAR.

As shown in (a) of FIG. 3D, the conductive pattern portion CP and the bumps B1 and B2 of the first chip C1 must be aligned with each other in the vertical direction. However, when the first chip C1 is attached through a high-temperature bonding process, as shown in (b) of FIG. 3D, the conductive pattern portion CP and the bumps B1 and B2 of the first chip C1 may be misaligned by a predetermined interval.

In contrast, as shown in FIG. 3E, the first connection portion 150 of the embodiment has a closed loop shape surrounding the region in which the first chip C1 is to be disposed, and may be arranged to surround the side surface of the first chip C1. In this case, the bonding condition of the first connection portion 150 is set to have a range of 80° C. to 150° C. Accordingly, in the bonding process, the misalignment problem or the thermal shock problem that may occur in the first chip C1 is solved. Accordingly, the first connection portion 150 may be a low-temperature curing type anisotropic conductive adhesive.

Meanwhile, with reference to FIGS. 3 to 8, a connection relationship with the main board 40 will be described.

A double-side flexible circuit board for chip on film 100 according to an embodiment may include: a substrate 100 including a through-hole; a wiring pattern layer 120 disposed on both sides of the substrate including the through-hole; a first plating layer 131 disposed on the wiring pattern layer 120; a second plating layer 132 disposed on the first plating layer 131; and a protective layer 140 partially disposed on the wiring pattern layer.

By forming the wiring pattern layer 120 on both sides of the substrate, it is possible to form a substrate having a size substantially similar to a fingerprint recognition chip.

A disposing region of the protective layer 400 in which the protective layer 140 is formed may be the protective portion PP. The conductive pattern portion CP may be exposed to the outside in a region other than the protective portion PP in which the protective layer 140 is not formed. That is, the conductive pattern portion CP may be electrically connected to the first chip C1, the second chip C2, the third chip C3, and the main board 40 in an open region of the protective layer or a region in which the protective portion is not disposed on the conductive pattern portion.

A lead pattern portion and a test pattern portion of the flexible circuit board for chip on film according to the embodiment may not overlap with the protective portion. That is, the lead pattern portion and the test pattern portion may refer to a conductive pattern portion located in an open region that is not covered by a protective layer, and may be distinguished into a lead pattern portion and a test pattern portion according to functions.

The lead pattern portion may refer to a conductive pattern portion to be connected to the first chip, the second chip, the third chip C3, and the main board.

The test pattern portion TP may refer to a conductive pattern portion for checking whether the flexible circuit board for chip on film according to the embodiment and a fingerprint recognition module including the same is defective.

The lead pattern portion may be distinguished into an inner lead pattern portion and an outer lead pattern portion depending on a location. One region of a conductive pattern portion that is relatively close to the first chip C1 and is not overlapped by a protective layer may be represented as the inner lead pattern portion. One region of a conductive pattern portion that is located relatively far from the first chip C1 and is not overlapped by a protective layer may be represented as the outer lead pattern portion.

The flexible circuit board for chip on film may include a first inner lead pattern portion I1, a second inner lead pattern portion I2, a third inner lead pattern portion I3, a fourth inner lead pattern portion I4, a fifth inner lead pattern portion I5, and a sixth inner lead pattern portion I6.

The flexible circuit board for chip on film according to the embodiment may include an outer lead pattern portion OP.

The flexible circuit board for chip on film according to the embodiment may include a test pattern portion TP.

The first inner lead pattern portion I1, the second inner lead pattern portion I2, the third inner lead pattern portion I3, the fourth inner lead pattern portion I4, the fifth inner lead pattern portion I5, the sixth inner lead pattern portion I6, and the outer lead pattern portion OP may be disposed on one surface of the flexible circuit board 100 for chip on film according to the embodiment.

The test pattern portion TP may be disposed on the other surface opposite to the one surface of the flexible circuit board for chip on film according to the embodiment.

Meanwhile, a position of the outer lead portion OP and a position of the test pattern portion TP may be changed from each other. That is, in the drawing, the test pattern portion TP may be located at the position of the outer lead portion OP, and the outer lead portion OP may be located at the position of the test pattern portion TP.

In the drawing, the test pattern portion TP and the outer lead pattern portion OP are illustrated as being formed on the lower surface and the upper surface of the substrate, but a part or all of the plurality of patterns may be formed anywhere on the upper and lower surfaces according to design efficiency.

Preferably, when the flexible circuit board for chip on film is bent and attached to the main board, the upper surface is formed of the outer lead portion OP, and the lower surface is formed of the test pattern portion TP, and thus space limitation due to a plurality of pattern portions may be solved.

The first chip C1 disposed on one surface of the flexible circuit board for chip on film according to the embodiment may be connected to the first inner lead pattern portion I1 and the second inner lead pattern portion I2 via a first connection portion 150.

The first chip C1 disposed on one surface of the flexible circuit board for chip on film according to the embodiment may be electrically connected to the first inner lead pattern portion I1.

The first inner lead pattern portion I1 may transmit an electrical signal to a first via hole V1 along the upper surface of the substrate 110. The first via hole V1 and the first inner lead pattern portion I1 may be electrically connected to each other.

In addition, the first inner lead pattern portion I1 may be electrically connected to the first via hole V1 along the upper surface of the substrate 110, and an electrical signal may be transmitted to the third via hole V3 along the lower surface of the substrate 110 through the conductive material filled in the first via hole V1. In this case, the signal transmitted through the first via hole V1 and the third via hole V3 may be a signal transmitted between the second chip C2 and the first chip C1. Preferably, the signal transmitted through the first via hole V1 and the third via hole V3 may be a control signal of the first chip C1 transmitted through the main board 40.

In other words, a signal transmission line from the first chip C1 may be disposed on the lower surface of the substrate 110 through the via hole as described above.

Through this, a transmission signal Tx for fingerprint recognition is formed on the lower surface of the flexible circuit board 100 for chip on film and has a relatively long signal transmission line. A reception signal Rx signal that returns after the fingerprint is recognized may be formed on the upper surface and may be made shorter than the transmission signal transmission line to recognize a clearer fingerprint. Preferably, the number of transmission signal Tx signal transmission lines may be made larger on the lower surface of the flexible circuit board 100 for chip on film than the number of reception signal Rx signal transmission lines.

The first chip C1 disposed on one surface of the flexible circuit board 100 for chip on film according to the embodiment may be electrically connected to the second inner lead pattern portion I2 through the first connection portion 150.

The second inner lead pattern portion I2 disposed on the upper surface of the substrate 110 may be connected to the fourth via hole V4 and the test pattern portion TP along the lower surface of the substrate 110 through a conductive material filled in the second via hole V2 located under the second inner lead pattern portion I2.

The test pattern portion TP may confirm a failure of an electrical signal that may be transmitted through the via hole V1, V2, V3, and V4. For example, accuracy of a signal transmitted to the first inner lead pattern portion I1 may be confirmed via the test pattern portion TP. In detail, by measuring a voltage or a current in the test pattern portion TP, it may be possible to confirm whether a short circuit or a short occurs or a generated location of the short circuit or short in the conductive pattern portion located between the first chip and the second chip, thereby improving reliability of a product.

In addition, the second chip C2 is electrically connected to the third inner lead pattern portion I3, the fourth inner lead pattern portion I4, and the fifth inner lead pattern portion I5 via a first sub second connection portion 161, a second sub second connection portion 162, and a third sub second connection portion 163, respectively. In this case, the third inner lead pattern portion I3 may be directly connected to the second inner lead pattern portion I2 via a wiring located on the upper surface of the substrate without passing through a via hole. In this case, in the third inner lead pattern portion I3 and the second inner lead pattern portion I2, a sensing signal acquired at the first chip C1 may be a signal transmission line transmitted to the second chip C2.

That is, the second chip C2 performs analog signal processing, and accordingly, accuracy of an output signal is determined according to accuracy of a received signal. At this time, the longer the transmission line of the received signal is, the greater the degree of loss of the signal becomes, and accordingly, the accuracy of the signal received by the second chip C2 is lowered. Therefore, in the present invention, between the first chip C1 and the second chip C2, a signal reception line of the second chip C2 may be located on the upper surface of the substrate to minimize the length of the signal transmission line and minimize the signal loss.

The display panel 30 may include a lower substrate and an upper substrate.

When the display panel is a liquid crystal display panel, the display panel 30 may be formed having a structure in which the lower substrate including a thin film transistor (TFT) and a pixel electrode and the upper substrate including color filter layers are bonded with a liquid crystal layer interposed therebetween.

In addition, the display panel 30 may be a liquid crystal display panel of a color filter on transistor (COT) structure in which a thin film transistor, a color filter, and a black matrix are formed on the lower substrate, and the upper substrate is bonded to the lower substrate with a liquid crystal layer interposed therebetween.

In addition, when the display panel 30 is a liquid crystal display panel, a backlight unit that provides light under the display panel 30 may be further included.

When the display panel 30 is an organic electroluminescence display panel, the display panel 30 may include a self-luminous element that does not require a separate light source. In the display panel 30, a thin film transistor may be formed on the lower substrate, and an organic light emitting element in contact with the thin film transistor may be formed. The organic light emitting element may include an anode, a cathode, and an organic light emitting layer formed between the anode and the cathode. In addition, an upper substrate configured to function as an encapsulation substrate/barrier substrate for encapsulation on the organic light emitting element may be further included. The upper substrate may be rigid or flexible.

In addition, a polarizing plate may be further included under the cover window 70. The polarizing plate may be a linear polarizing plate or an external light reflection preventive polarizing plate. For example, when the display panel 30 is a liquid crystal display panel, the polarizing plate may be a linear polarizing plate. Further, when the display panel 30 is an organic electroluminescence display panel, the polarizing plate may be an external light reflection preventive polarizing plate.

A received signal may be weak due to the presence of such many layers between the fingerprint recognition module and the hand of a person providing a fingerprint. Therefore, the signal reception line of the fingerprint recognition module may be located on the upper surface of the substrate to minimize the length of the signal transmission line and minimize the loss of the received signal.

Meanwhile, the third chip C3 is electrically connected to the sixth inner lead pattern portion I6 via the third connection portion 170. In addition, the sixth inner lead pattern portion I6 may be electrically connected to the fourth inner lead pattern portion I4 or the fifth inner lead pattern portion I5.

The fingerprint recognition module 100 including the flexible circuit board for chip on film according to the embodiment may realize a conductive pattern portion with a fine pitch on both surfaces thereof, and thus it may be suitable for an electronic device having a high-resolution display unit.

In addition, the fingerprint recognition module 100 including the flexible circuit board for chip on film according to the embodiment is flexible, small in size, and thin in thickness, and thus it may be used for various electronic devices.

For example, referring to FIG. 9, the fingerprint recognition module 100 including the flexible circuit board for chip on film according to the embodiment may be reduced a bezel, and thus it may be used for an edge display.

For example, referring to FIG. 10, the fingerprint recognition module 100 including the flexible circuit board for chip on film according to the embodiment may be included in a fordable flexible electronic device. Therefore, the touch device including the same may be a flexible touch device.

And thus, a user may fold or bend by hand. Such a flexible touch window may be applied to a wearable touch device or the like.

For example, referring to FIG. 11, the fingerprint recognition module 100 including the flexible circuit board for chip on film according to the embodiment may be applied to various electronic devices to which a foldable display device is applied. Referring also to FIGS. 11A to 11C, the foldable display device may fold a foldable cover window. The foldable display device may be included in various portable electronic products. Specifically, the foldable display device may be included in a mobile terminal (mobile phone), a notebook (portable computer), and the like. Accordingly, while increasing the display region of a portable electronic product, a size of the device may be reduced during storage and transportation, and thus portability may be improved. Therefore, convenience of a user of the portable electronic product may be improved. However, the embodiment is not limited thereto, and of course, the foldable display device may be used for various electronic products.

Referring to FIG. 11A, a foldable display device may include one folding region in a screen region. For example, the foldable display device may have a C-shape in a folded form. That is, in the foldable display device, one end and the other end opposite to the one end may be overlapped with each other. At this time, the one end and the other end may be disposed close to each other. For example, the one end and the other end may be disposed to face each other.

Referring to 11B, a foldable display device may include two folding regions in a screen region. For example, the foldable display device may have a G-shape in a folded form. That is, the foldable display device may be overlapped with each other by folding one end and the other end opposite to the one end in a direction corresponding to each other. At this time, the one end and the other end may be spaced apart from each other. For example, the one end and the other end may be disposed in parallel to each other.

Referring to FIG. 11C, a foldable display device may include two folding regions in a screen region. For example, the foldable display device may have an S-shape in a folded form. That is, in the foldable display device, one end and the other end opposite to the one end may be folded in different directions. At this time, the one end and the other end may be spaced apart from each other. For example, the one end and the other end may be disposed in parallel to each other.

Although not shown in the drawings, of course, the fingerprint recognition module 100 including the flexible circuit board for chip on film according to the embodiment may be applied to a rollable display.

Referring to FIG. 12, the fingerprint recognition module 100 including the flexible circuit board for chip on film according to the embodiment may be included in various wearable touch devices including a curved display. Therefore, an electronic device including the fingerprint recognition module 100 including the flexible circuit board for chip on film according to the embodiment may be reduced in thickness, size and weight.

Referring to FIG. 13, the fingerprint recognition module 100 including the flexible circuit board for chip on film according to the embodiment may be used for various electronic devices having a display portion such as a TV, a monitor, and a laptop computer.

The invention claimed is:

1. A fingerprint recognition module comprising:
a substrate;
a conductive pattern portion disposed on the substrate;
a protective layer partially disposed on the substrate and the conductive pattern portion;
a first connection portion disposed on a conductive pattern portion exposed through a first open region of the protective layer; and
a first chip disposed on the first connection portion,
wherein the first connection portion includes:
an anisotropic conductive adhesive disposed on the conductive pattern portion exposed through the first open region and including conductive particles, and
wherein the first connection portion extends upwardly in a region between the conductive pattern portion and the first chip and surrounds a side surface of the first chip.

2. The fingerprint recognition module of claim 1, wherein the first connection portion has a closed loop shape.

3. The fingerprint recognition module of claim 1, wherein a width in a vertical direction of the first connection portion disposed on the side surface of the first chip has a range of 20% to 90% of a thickness of the first chip.

4. The fingerprint recognition module of claim 1, wherein the first connection portion includes:
a first portion disposed on the conductive pattern portion exposed through the first open region; and
a second portion connected to the first portion and disposed on the substrate between the exposed conductive pattern portion.

5. The fingerprint recognition module of claim 4, wherein conductive particles disposed in the first portion electrically connect a bump disposed on a lower surface of the first chip and the exposed conductive pattern portion, and
wherein conductive particles disposed in the second portion are separated from the conductive particles disposed in the first portion.

6. The fingerprint recognition module of claim 1, wherein a width in a horizontal direction of the first connection portion has a range between 0.05 mm and 5 mm.

7. The fingerprint recognition module of claim 5, wherein a lower surface of the bump of the first chip includes:
a first lower surface in contact with the first connection portion; and
a second lower surface that is not in contact with the first connection portion;
wherein the second lower surface is adjacent to a sensing available region under the first chip.

8. The fingerprint recognition module of claim 1, wherein the anisotropic conductive adhesive is an anisotropic conductive adhesive film or an anisotropic conductive adhesive paste that is cured within a range between 80° C. and 150° C.

9. The fingerprint recognition module of claim 1, wherein the first chip includes a fingerprint recognition sensor including a polymer compound.

10. The fingerprint recognition module of claim 1, further comprising:
a second connection portion disposed on a conductive pattern portion exposed through a second open region of the protective layer; and
a second chip disposed on the second connection portion;
wherein the second connection portion includes a different material than the first connection portion.

11. The fingerprint recognition module of claim 10, wherein the second chip includes an application specific integrated circuit.

12. The fingerprint recognition module of claim 10, wherein the second connection portion includes a solder bump.

13. The fingerprint recognition module of claim 10, further comprising:
a side molding portion disposed on the second connection portion and disposed to surround a periphery of the second chip.

14. An electronic device comprising:
a fingerprint recognition module including a substrate; a conductive pattern portion disposed on the substrate; a protective layer partially disposed on the substrate and the conductive pattern portion; a first connection portion disposed on a conductive pattern portion exposed through a first open region of the protective layer; a first chip disposed on the first connection portion; a second connection portion disposed on a conductive pattern portion exposed through a second open region of the protective layer; and a second chip disposed on the second connection portion, wherein the first connection portion includes an anisotropic conductive adhesive disposed on the conductive pattern portion exposed through the first open region and including conductive particles, wherein the second connection portion includes a solder bump, wherein the first chip includes a fingerprint recognition sensor, and the substrate includes a first non-bending region positioned at one end, a second non-bending region positioned at the other end opposite to the one end, and a bending region positioned between the first and second non-bending regions, and wherein the first open region is positioned on the first non-bending region, and the second open region is positioned on the second non-bending region;
a display unit attached on the first chip; and
a main board connected to the conductive pattern portion disposed on the second non-bending region of the fingerprint recognition module, and
wherein the first connection portion extends upwardly in a region between the conductive pattern portion and the first chip and surrounds a side surface of the first chip.

15. The electronic device of claim 14, wherein the display unit includes:
a display panel; and
a cover window positioned on the display panel,
wherein the first chip is attached to a lower surface of the display panel or a lower surface of the cover window.

16. The electronic device of claim 14, wherein the first connection portion has a closed loop shape.

17. The electronic device of claim 15, wherein a width in a vertical direction of the first connection portion disposed on the side surface of the first chip has a range of 20% to 90% of a thickness of the first chip.

18. The electronic device of claim 15, wherein the first connection portion includes:
a first portion disposed on the conductive pattern portion exposed through the first open region; and
a second portion connected to the first portion and disposed on the substrate between the exposed conductive pattern portion.

19. The electronic device of claim 18, wherein conductive particles disposed in the first portion electrically connect a bump disposed on a lower surface of the first chip and the exposed conductive pattern portion, and
wherein conductive particles disposed in the second portion are separated from the conductive particles disposed in the first portion.

20. The electronic device of claim 19, wherein a lower surface of the bump of the first chip includes:
a first lower surface in contact with the first connection portion; and
a second lower surface that is not in contact with the first connection portion;
wherein the second lower surface is adjacent to a sensing available region under the first chip.

* * * * *